United States Patent
Kawase

(10) Patent No.: US 7,045,012 B2
(45) Date of Patent: May 16, 2006

(54) JETTING METHOD OF LIQUID, JETTING APPARATUS OF LIQUID, PRODUCTION METHOD OF SUBSTRATE FOR ELECTRO-OPTICAL APPARATUS AND PRODUCTION METHOD OF ELECTRO-OPTICAL APPARATUS

(75) Inventor: Tomomi Kawase, Matsumoto (JP)

(73) Assignee: Seiko Epson Corporation, (JP)

( * ) Notice: Subject to any disclaimer, the term of this patent is extended or adjusted under 35 U.S.C. 154(b) by 0 days.

(21) Appl. No.: 10/615,495

(22) Filed: Jul. 8, 2003

(65) Prior Publication Data

US 2004/0071872 A1    Apr. 15, 2004

(30) Foreign Application Priority Data

Jul. 9, 2002  (JP) .............................. 2002-200408
Jul. 9, 2002  (JP) .............................. 2002-200413

(51) Int. Cl.
*B05C 11/02*  (2006.01)
*B05C 5/00*   (2006.01)
*B05B 7/00*   (2006.01)

(52) U.S. Cl. ..................... 118/313; 118/52; 118/612; 118/46

(58) Field of Classification Search ............. 118/113, 118/52, 612, 313, 46
See application file for complete search history.

(56) References Cited

U.S. PATENT DOCUMENTS

| | | | |
|---|---|---|---|
| 5,831,645 A | * | 11/1998 | Shimoda ..................... 347/30 |
| 5,935,331 A | * | 8/1999 | Naka et al. ................. 118/319 |
| 6,518,056 B1 | * | 2/2003 | Schembri et al. ........ 435/287.2 |

FOREIGN PATENT DOCUMENTS

| | | |
|---|---|---|
| CN | 1127696 A | 7/1996 |
| JP | 08-071489 | 3/1996 |
| JP | 08-196983 | 8/1996 |

(Continued)

OTHER PUBLICATIONS

English Translated Abstract—JP-10166574A.*

(Continued)

*Primary Examiner*—Chris Fiorilla
*Assistant Examiner*—Yewebdar Tadesse
(74) *Attorney, Agent, or Firm*—Harness, Dickey & Pierce, P.L.C.

(57) ABSTRACT

In a method and apparatus for jetting a liquid from a nozzle of a droplet jet head and applying it to a substrate, a jet amount of the liquid to any one of at least two divided regions of a coating region of the substrate is controlled to be greater than a jet amount to the other divided regions. A spin coater can be used to rotate the substrate. To divide the coating region of the substrate, the substrate can be divided into at least an inside circumferential region and an outside circumferential region positioned at predetermined distances from the center of rotation of the substrate. In this case, the jet amount to the outside region is greater than the jet amount to the inside region.

10 Claims, 25 Drawing Sheets

FOREIGN PATENT DOCUMENTS

| | | |
|---|---|---|
| JP | 08-250389 | 9/1996 |
| JP | 08-279448 | 10/1996 |
| JP | 08-314148 | 11/1996 |
| JP | 09-010657 | 1/1997 |
| JP | 09-075825 | 3/1997 |
| JP | 10166574 A * | 6/1998 |
| JP | 10-284381 | 10/1998 |
| JP | 11-165114 | 6/1999 |
| JP | 2000-033320 | 2/2000 |
| JP | 2000-153210 | 6/2000 |
| JP | 2000-288455 | 10/2000 |
| JP | 2000-301043 | 10/2000 |
| JP | 2001-174819 | 6/2001 |
| JP | 2001-334198 | 12/2001 |

OTHER PUBLICATIONS

Communication from Japanese Patent Office re: counterpart application 2002-200408.

Communication from Japanese Patent Office re: counterpart application 2002-200413.

Communication from China Patent Office regarding related application.

* cited by examiner

REPEAT 4 TIMES

STRIPE

MOSAIC

DELTA

JETTING METHOD OF LIQUID, JETTING APPARATUS OF LIQUID, PRODUCTION METHOD OF SUBSTRATE FOR ELECTRO-OPTICAL APPARATUS AND PRODUCTION METHOD OF ELECTRO-OPTICAL APPARATUS

BACKGROUND OF THE INVENTION

1. Field of the Invention

This invention relates to a liquid jetting method and a liquid jetting apparatus. More particularly, this invention relates to a liquid jetting method and a liquid jetting apparatus that can yield a film having a uniform thickness and have high usage efficiency of the liquid. The invention further relates to an electro-optical apparatus substrate production method and an electro-optical apparatus production method using the liquid jetting method.

2. Description of the Related Art

Coating methods such as spin coating, die coating, roll coating, and the like, are known for forming a relatively thin film on a semiconductor substrate, a liquid crystal display device or a color filter substrate. Among these coating methods, the spin coating method is generally believed to be the most optimal for forming a thin and uniform film of a micron order.

According to the spin coating method, a to-be-coated substrate on which a film is to be formed (hereinafter referred to as "substrate") is held on a spin chuck and a liquid to be applied, such as a resist material, is applied drop-wise to the center of the substrate. The substrate is then rotated at a high speed so that the resulting centrifugal force diffuses the liquid from the center of the substrate in an outer circumferential direction to thereby form a film.

The spin coating method is more suitable for forming a film having a small distribution of film thickness and a uniform thickness than other coating methods. However, because about 90% or more of the liquid applied drop-wise is diffused from the surface of the substrate to its surrounding and is leveled, the method is not free from the drawback that the liquid is consumed in vain and is not advantageous from the aspect of both environment and economy.

Therefore, JP-A-H08-250389 discloses a thin film formation apparatus and a thin film formation method for suppressing wasteful consumption of the liquid and forming a film having a uniform film thickness even when a substrate is warped and includes concavo-convexity, as shown in FIG. 26. More particularly, in the thin film formation apparatus and the thin film formation method, a plurality of nozzles of an ink jet system for intermittently jetting a predetermined amount of a liquid is arranged in a predetermined direction. These nozzles are moved linearly and relatively in a direction crossing at right angles with the arrangement direction to apply the liquid onto a substrate.

JP-A-H08-314148 discloses a production method of a resin film as shown in FIG. 27. More particularly, to reduce portions having a non-uniform film thickness (that is, beads) and to expand a useful area, this reference describes a production method of a resin film including the steps of arranging a resin film on a substrate by a nozzle of an ink jet system, and locally controlling a temperature of an outer edge portion by second heating means disposed separately from first heating means in a process step of heating and drying the resin film by the first heating means.

JP-A-H09-10657 discloses a thin film formation apparatus to form a thin film having a predetermined film thickness with reduced waste of a coating solution as shown in FIG. 28. More particularly, this reference discloses a thin film formation apparatus including (1) an ink jet head having a plurality of fine nozzles for jetting a coating solution against a substrate, (2) a rotation means for rotating the substrate, (3) a relative movement means for moving relatively the ink jet head between a proximity region of a rotating shaft and a spaced-apart region and (4) a relative movement control means for decreasing the relative movement speed of the relative movement means from the proximity region of the rotating shaft toward the spaced-apart region, or decreasing an angular velocity.

JP-A-2001-174819 discloses a coating film formation method and a film formation apparatus to form a film having excellent uniformity of a film thickness while reducing a material cost as shown in FIG. 29. More particularly, the reference describes a coating film formation method and a film formation apparatus including (1) a step of supplying a film material in a droplet form or a mist form by an ink jet nozzle to a film formation region of a substrate placed horizontally inside a processing chamber and (2) a step of rotating the substrate to which the film material is supplied so as to diffuse the film material on the substrate to form a coating film.

As shown in FIG. 30, JP-A-2000-288455 discloses a resist application apparatus to efficiently form first and second resist thin films formed of a plurality of resist materials having different densities. More particularly, the reference discloses a resist application apparatus provided with (1) a data storage portion for storing a position of a first region for forming a first resist thin film and a position of a second region for forming a second resist thin film, (2) a first resist coating portion for forming the first resist thin film in the first region, (3) a second resist coating portion for forming the second resist thin film in the second region, and (4) a resist coating control portion for conducting control so that a plurality of resist materials having mutually different densities can be selectively applied.

The formation apparatus and the formation method of the thin film formed of the liquid disclosed in JP-A-H08-250389 is suitable when the substrate is rectangular in shape and its size is specified because the nozzle of the ink jet system is moved linearly and relatively in the predetermined direction. However, this method may be wasteful of the liquid when the liquid is applied to a circular substrate or to substrates having different sizes.

Columnar spacers are disposed in some cases on the substrate. In this case, the columnar spacers become obstacles for sufficiently diffusing the liquid, and formation of the thin film with a uniform thickness becomes more and more difficult.

The production method of the resin film disclosed in JP-A-H08-314148 must locally control the temperature of the outer edge portion by disposing the second heating means in the heating and drying step of the resin film. Therefore, the production apparatus becomes large, the production cost becomes high and the production time becomes elongated. The method that locally controls the temperature of the outer edge portion by disposing the second heating means has low usage efficiency of the coating solution and moreover, cannot easily form a thin film having a uniform thickness inclusive of the film thickness distribution near the center of rotation of the substrate.

In the thin film formation apparatus disclosed in JP-A-H09-10657, the liquid is applied while the angular velocity or the moving speed is controlled, but fine control is difficult in practice. Since this art is basically intended to jet a predetermined amount of the coating solution from the ink jet head, the moving speed of the head or the angular velocity must be reduced at the outer peripheral portion of the substrate, and a long time is necessary for printing. When the viscosity of the coating solution and its solid content vary depending on the ambient condition, it becomes difficult to jet a predetermined amount of the coating solution from the ink jet head. It is eventually difficult to form a thin film having a uniform thickness while usage efficiency of the coating solution is improved.

The coating film formation method disclosed in JP-A-2001-174819 supplies the film material either in the droplet form or in the mist form to the entire surface of the substrate at one time. Therefore, when a predetermined amount of the coating solution can always be jetted from the ink jet head, the method is effective for forming the thin film having a uniform thickness. However, when the viscosity of the coating solution and its solid content vary depending on the ambient condition, the problem develops in that the film thickness near the center of rotation of the substrate is likely to become great.

Further, the resist coating apparatus disclosed in JP-A-2000-288455 is an effective application means for forming a plurality of resists having different densities or the like within a short time, but is not free from the problem that the film thickness is likely to become great near the center of rotation of the substrate.

SUMMARY OF THE INVENTION

To solve the problems described above, the invention aims to provide a liquid jetting method and a liquid jetting apparatus that can yield a film having a small film thickness distribution and a uniform thickness across a substrate by appropriately varying a jet amount of a liquid to be applied to the substrate and can reduce the waste of the liquid applied so as to improve usage efficiency. To accomplish this object, the invention has the following features.

In a liquid jetting method for applying a liquid jetted from a nozzle of a droplet jet head to a substrate, a liquid jetting method of the invention comprises the steps of dividing a coating region of the substrate into at least two regions, and setting a jet amount of the liquid to any one of the at least two divided regions to a greater value than to the other of the divided regions.

Because the jet amount of the liquid from the droplet jet head is varied in such a manner as to correspond to a position of the substrate to be applied with the liquid, a film having a small film thickness distribution and a uniform thickness throughout a substrate can be acquired. Also because the liquid is jetted from the nozzle of the droplet jet head and a jet amount of the liquid from the droplet jet head is varied, waste of the liquid applied can be reduced and usage efficiency of the liquid can be improved.

To execute the liquid jetting method of the invention, it is preferred to prepare a plurality of droplet jet heads as the droplet jet head and to apply the liquid by use of different droplet jet heads to regions to which the liquid is applied. This method can further decrease the film thickness distribution throughout the entire substrate, and can reduce waste of the liquid applied so as to improve usage efficiency of the liquid.

To execute the liquid jetting method of the invention, it is preferred to vary the jet amount of the liquid to the substrate either step-wisely or continuously. Because this method can finely control the jet amount of the liquid in accordance with the size of the substrate and its surface condition, it is possible to make the film thickness distribution small throughout the entire substrate, and to reduce waste of the liquid applied so as to improve usage efficiency of the liquid.

To execute the liquid jetting method of the invention, it is preferred to keep the jet amount of the liquid proportional to a distance from a specific position of the substrate. It becomes thus possible to solve the problem that the film thickness at a part of the substrate becomes great, to make the film thickness distribution small throughout the entire substrate, and to reduce waste of the liquid applied so as to improve usage efficiency of the liquid.

To execute the liquid jetting method of the invention, it is preferred to apply the liquid while the droplet jet head is moved. Because this method can finely control the jet amount of the liquid in accordance with the size of the substrate, its surface condition or its position, it is possible to make the film thickness distribution small throughout the entire substrate, and to reduce waste of the liquid applied so as to improve usage efficiency of the liquid.

To execute the liquid jetting method of the invention, it is preferred to control the jetting operation of the droplet jet head in accordance with a distance between the droplet jet head and the substrate and the moving speed of the substrate. Because this method can finely control the jet amount of the liquid in accordance with the size of the substrate, its surface condition or characteristics of the liquid, it is possible to make the film thickness distribution small throughout the entire substrate and to reduce waste of the liquid applied so as to improve usage efficiency of the liquid.

To execute the liquid jetting method of the invention, it is preferred that the droplet jet head have a plurality of nozzles. Because this method can finely control the jet amount of the liquid in accordance with the size of the substrate, its surface condition or characteristics of the liquid, it is possible to make the film thickness distribution small throughout the entire substrate, and to reduce waste of the liquid applied so as to improve usage efficiency of the liquid.

To execute the liquid jetting method of the invention, it is preferred to vary an orientation angle of a nozzle train in an arrangement direction relative to a reference direction of the substrate in accordance with a distance from a specific position of the substrate. Because this method can finely control the jet amount of the liquid in accordance with the size of the substrate, its surface condition or characteristics of the liquid even in a simple droplet jet head structure, it is possible to vary a unit coating amount of the liquid to the substrate.

In a liquid jetting method for applying a liquid jetted from a nozzle of a droplet jet head to a non-circular substrate, another liquid jetting method of the invention comprises the step of sequencing a non-jetting time in which the liquid is not jetted with a jetting time in which the liquid is jetted from the nozzle of the droplet jet head.

Because the non-jetting time is sequenced, even when the substrate is non-circular and the non-circular substrate to be applied with the liquid does not exist at the jet position of the nozzle of the droplet jet head, the possibility that the liquid is applied to locations other than the substrate becomes small and eventually, the liquid can be applied without waste.

To execute the liquid jetting method of the invention, it is preferred to synchronize the non-jetting time with a time when the non-circular substrate does not exist at the jet position of the nozzle of the droplet jet head. Even when the non-circular substrate to be applied with the liquid does not exist at the jet position of the nozzle of the droplet jet head, this method can reliably decrease the possibility that the liquid is applied to locations other than the substrate, and can reliably apply the liquid to a desired position on the substrate.

To execute the liquid jetting method of the invention, it is preferred to sequence the steps of jetting the liquid from the nozzle of the droplet jet head, applying the liquid to the substrate and diffusing the liquid in a predetermined direction or in a circumferential direction so as to diffuse the liquid applied. This method can yield a film having a small film thickness distribution and a uniform thickness throughout the entire substrate even when the coating amount of the liquid is not uniform at a part of the substrate.

Next, in a liquid jetting apparatus for jetting a liquid to be applied onto a substrate, a liquid jetting apparatus according to the invention comprises (1) a droplet jet head having at least one nozzle, and (2) jet amount control means for controlling a jet amount of the liquid from the nozzle so that the jet amount of the liquid to any one of at least two divided regions of a liquid coating region of the substrate is greater than a jet amount to the other of the divided regions.

In other words, because the jet amount control means varies the jet amount of the liquid from the droplet jet head in such a manner as to correspond to the position of the substrate to be applied with the liquid, this method can yield a film having a small film thickness distribution and a uniform thickness throughout the entire substrate. The liquid is jetted from the nozzle of the droplet jet head and the jet amount of the liquid from the droplet jet head is varied under the control of the jet amount control means. Therefore, waste of the liquid applied can be reduced and usage efficiency of the liquid can be improved.

Another liquid jetting apparatus according to the invention is a liquid jetting apparatus for jetting a liquid to be applied to a substrate from a droplet jet head including a nozzle train having a plurality of nozzles, wherein an orientation angle of the nozzle train in an arrangement direction relative to a reference direction of the substrate is varied in accordance with a distance from a specific position of the substrate.

In other words, because the orientation angle of the nozzle train in its arrangement direction is varied in such a manner so as to correspond to the distance from a specific position of the substrate to be applied with the liquid, the unit jet amount of the liquid from the droplet jet head can be varied. Consequently, it is possible to acquire a film having a small film thickness distribution and a uniform thickness throughout the entire substrate, and to reduce waste of the liquid applied so as to improve usage efficiency of the liquid.

Another liquid jetting method according to the invention is a liquid jetting method for applying a liquid jetted from a nozzle of a droplet jet head to a substrate rotated by a spin coater or to a substrate that has already rotated, which comprises the steps of dividing a coating region of the substrate into at least an inside circumferential region and an outside circumferential region positioned at predetermined distances from a center of rotation of the substrate, and setting a jet amount of the liquid to the outside region to a greater jet amount than a jet amount of the liquid to the inside region.

According to this jetting method, the jet amount of the liquid from the droplet jet head is varied in such a manner so as to correspond to a position of the substrate to be applied with the liquid, that is, the inside region and the outside region. Therefore, it is possible to acquire a film having a small film thickness distribution and a uniform thickness throughout the entire substrate.

Because the liquid is jetted from the nozzle of the droplet jet head and the jet amount of the liquid from the droplet jet head is varied, it is possible to reduce waste of the liquid applied so as to improve usage efficiency of the liquid.

In the liquid jetting method according to the invention, it is preferred to prepare a plurality of droplet jet heads as the droplet jet head and to apply the liquid to the inside region and to the outside region by use of different droplet jet heads. It becomes possible in this way to make the film thickness distribution smaller throughout the entire substrate, and to reduce waste of the liquid applied so as to improve usage efficiency of the liquid.

In the liquid jetting method according to the invention, it is preferred to vary the jet amount of the liquid to the substrate from the center of rotation of the substrate toward the outside either step-wisely or continuously. It becomes possible in this way to finely control the jet amount of the liquid in accordance with the size of the substrate and its surface condition. Therefore, it is possible to make the film thickness distribution smaller throughout the entire substrate, and to reduce waste of the liquid applied so as to improve usage efficiency of the liquid.

In the liquid jetting method according to the invention, it is preferred to make the jet amount of the liquid proportional to a distance from the center of rotation of the substrate. It becomes possible in this way to solve the problem that the film thickness is likely to become greater near the center of rotation of the substrate, to make the film thickness distribution smaller throughout the entire substrate, and to reduce waste of the liquid applied so as to improve usage efficiency of the liquid.

In the liquid jetting method according to the invention, it is preferred to apply the liquid while the droplet jet head is being moved. Because the jet amount of the liquid can be finely controlled in accordance with the size of the substrate and its surface condition or its position, it becomes possible to make the film thickness distribution smaller throughout the entire substrate, and to reduce waste of the liquid applied so as to improve usage efficiency of the liquid.

In the liquid jetting method according to the invention, it is preferred to control the jetting operation of the droplet jet head in accordance with a distance between the droplet jet head and the substrate and with an angular velocity of the spin coater. Because the jet amount of the liquid can be finely controlled in this way in accordance with the size of the substrate and its surface condition or with the characteristics of the liquid, it becomes possible to make the film thickness distribution smaller throughout the entire substrate, and to reduce waste of the liquid applied so as to improve usage efficiency of the liquid.

In the liquid jetting method according to the invention, the droplet jet head preferably has a plurality of nozzles. Because the jet amount of the liquid can be finely controlled in this way in accordance with the size of the substrate and with its surface condition or with the characteristics of the liquid, it becomes possible to make the film thickness distribution smaller throughout the entire substrate, and to reduce waste of the liquid applied so as to improve usage efficiency of the liquid.

In the liquid jetting method according to the invention, it is preferred to vary the orientation angle of the nozzle train in the arrangement direction relative to the radial direction of the substrate in accordance with the distance from the center of rotation of the substrate. Because the jet amount of the liquid can be finely controlled in this way in accordance with the size of the substrate and its surface condition or the characteristics of the liquid even when the droplet jet head has a simple structure, it becomes possible to vary the unit coating amount of the liquid to the substrate.

Next, another liquid jetting method according to the invention is a liquid jetting method for applying a liquid jetted from a nozzle of a droplet jet head to a non-circular substrate rotated by a spin coater or to a non-circular substrate that has already rotated, which comprises the step of sequencing a non-jetting time in which the liquid is not jetted with a jetting time in which the liquid is jetted from the nozzle of the droplet jet head.

Because the liquid jetting method is executed while the non-jetting time is sequenced, the possibility that the liquid is applied to locations other than the substrate becomes small even when the shape of the substrate is non-circular and the non-circular substrate to be applied with the liquid does not exist at the jet position of the nozzle of the droplet jet head. Eventually, the liquid can be applied without waste.

In the liquid jetting method according to the invention, the non-jetting time is preferably synchronized with a time when the non-circular substrate to be coated with the liquid does not exist at the jet position of the nozzle of the droplet jet nozzle. In this way, even when the non-circular substrate to be applied with the liquid does not exist at the jet position of the nozzle of the droplet jet head, the possibility that the liquid is applied to locations other than the substrate becomes reliably small, and the liquid can be reliably applied to a desired position on the substrate.

Next, another liquid jetting apparatus according to the invention is a liquid jetting apparatus for jetting a liquid to be applied onto a stationary or rotating substrate, which comprises (1) a droplet jet head having at least one nozzle; (2) a spin coater for rotating the substrate; and (3) jet amount control means for controlling a jet amount of the liquid from the nozzle so that the jet amount of the liquid to an outside region is greater than a jet amount of the liquid to an inside region when a liquid coating region of the substrate is divided into at least an inside circumferential region and an outside circumferential region, positioned at predetermined distances from the center of rotation of the substrate.

In other words, the jet amount control means varies the jet amount of the liquid from the droplet jet head in such a manner so as to correspond to the position of the substrate applied with the liquid (that is, the inside region and the outside region). Therefore, it is possible to provide a film having a small film thickness distribution and uniform thickness throughout the entire substrate. Because the liquid is jetted from the nozzle of the droplet jet head while varying the jet amount of the liquid from the droplet jet head under the control of the jet amount control means, it is possible to reduce waste of the liquid applied so as to improve usage efficiency of the liquid. Further, because the liquid is jetted from the nozzle of the droplet jet head under the control of the jet amount control means, it is possible to acquire a film having a small film thickness distribution and a uniform thickness throughout the entire substrate irrespective of the shape of the substrate and the kind of liquid.

In the liquid jetting apparatus according to the invention, the nozzle preferably comprises a plurality of nozzles. These nozzles are preferably aligned so as to constitute a nozzle train, and an orientation angle of the nozzles in the arrangement direction relative to a radial direction of the substrate is preferably varied in accordance with a distance from the center of rotation of the substrate.

Because the orientation angle of the nozzle train in the arrangement direction is varied in such a manner as to correspond to the position of the substrate to be applied with the liquid (that is, the inside region and the outside region), it is possible to vary the unit jet amount of the liquid from the droplet jet head. Accordingly, it is possible to acquire a film having a small film thickness distribution and a uniform thickness throughout the entire substrate, and to reduce waste of the liquid applied so as to improve usage efficiency of the liquid.

In a production method of a substrate for an electro-optical apparatus for producing a substrate having a layer of electro-optical material thereon, a production method of a substrate for an electro-optical apparatus according to the invention comprises a liquid jetting step of applying a liquid jetted from a nozzle of a droplet jet head to the substrate, wherein a jet amount of the liquid to any one of at least two divided regions of a coating region of the substrate is greater than a jet amount to the other of the at least two divided regions. In this production method, the liquid is preferably an electro-optical material and/or a resist material used in a photolithography process.

Another production method of a substrate for an electro-optical apparatus according to the invention is a production method of a substrate for an electro-optical apparatus for producing a non-circular substrate having a layer of electro-optical material thereon, which comprises a liquid jetting step of applying a liquid jetted from a nozzle of a droplet jet head to the substrate, wherein a non-jetting time in which the liquid is not jetted is sequenced with a jetting time in which the liquid is jetted from the nozzle of the droplet jet head, in the liquid jetting step. Also in this production method, the liquid is preferably an electro-optical material itself and/or a resist material used in a photolithography process.

In a production method of an electro-optical apparatus for producing an electro-optical apparatus having a substrate including a layer of an electro-optical material thereon, a production method of an electro-optical apparatus according to the invention comprises a liquid jetting step of applying a liquid jetted from a nozzle of a droplet jet head to the substrate, wherein a jet amount of the liquid to any one of at least two divided regions of a coating region of the substrate is greater than a jet amount to the other of the at least two divided regions.

Another production method of an electro-optical apparatus according to the invention is a production method of an electro-optical apparatus for producing an electro-optical apparatus having a layer of an electro-optical material on a non-circular substrate, which comprises a liquid jetting step of applying a liquid jetted from a nozzle of a droplet jet head to the substrate, wherein a non-jetting time in which the liquid is not jetted is sequenced with a jetting time in which the liquid is jetted from the nozzle of the droplet jet head, in the liquid jetting step.

BRIEF DESCRIPTION OF THE DRAWINGS

FIGS. 5(A)–5(C) show a procedure for coating drop-wise the liquid from the droplet jet head onto a substrate, wherein FIG. 5(A) shows a state immediately after the liquid is jetted, FIG. 5(B) shows a state immediately after the liquid is applied drop-wise and FIG. 5(C) shows a state after the liquid is applied to a substrate to form a film;

DETAILED DESCRIPTION OF THE PREFERRED EMBODIMENTS

Figure 1A:
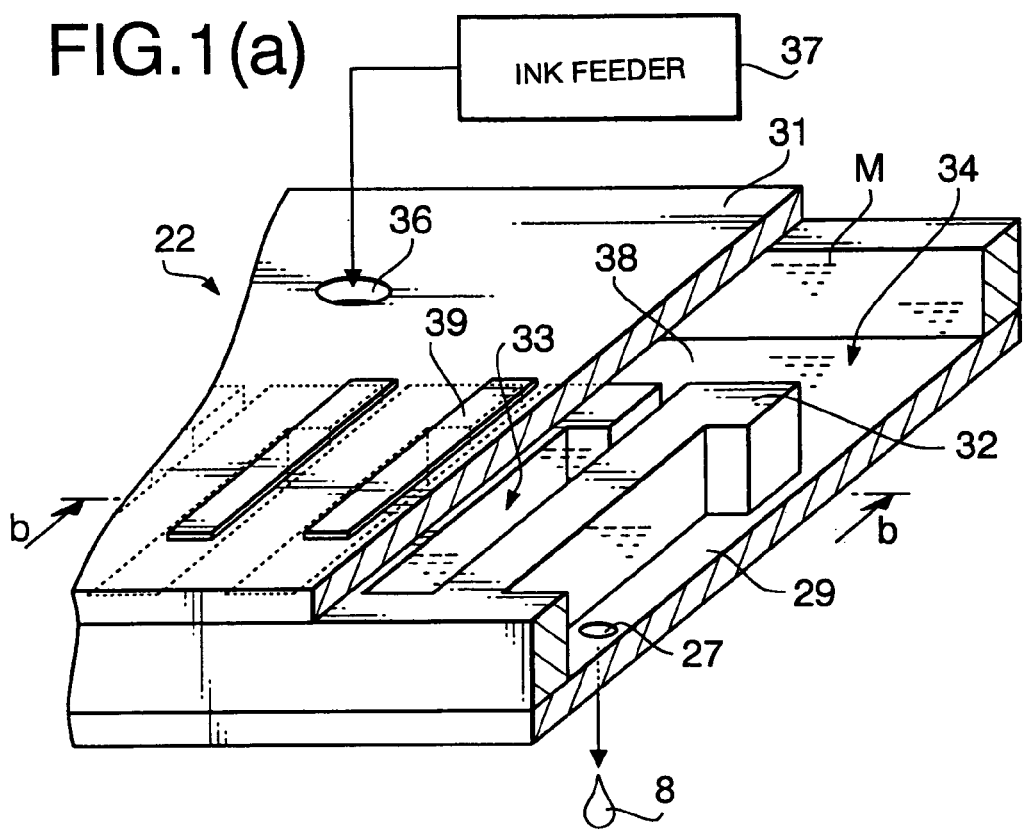
FIG. 1(A) is a partial cut-away perspective view schematically showing principal portions of a droplet jet head constituting a liquid jetting apparatus according to the invention.

Several preferred embodiments of the invention will be hereinafter explained with reference to the accompanying drawings. However, these embodiments represent a mode for carrying out the invention but do not limit the invention, and can be changed or modified in an arbitrary way without departing from the scope of the invention.

First Embodiment

The first embodiment relates to a liquid jetting method involving the steps of jetting a liquid from a nozzle of a droplet jet head and applying it to a substrate. According to this method, when a coating region of the substrate is divided into at least two regions, a jet amount of the liquid to either one of the divided regions is controlled to be greater than the jet amount to the other divided region.

The first embodiment also relates to a liquid jetting method involving the steps of jetting a liquid from a nozzle of a droplet jet head, and applying it to a substrate rotated by a spin coater or to a substrate that has already been rotated. According to this method, when a coating region of the substrate is divided into at least an inside circumferential region and an outside circumferential region positioned at predetermined distances from a center of revolution of the substrate, a jet amount of the liquid to the outside region is controlled to be greater than the jet amount of the liquid to the inside region.

The jetting method of the liquid according to the first embodiment will be hereinafter explained for each constituent element by appropriately referring to the drawings.

Figure 1B:
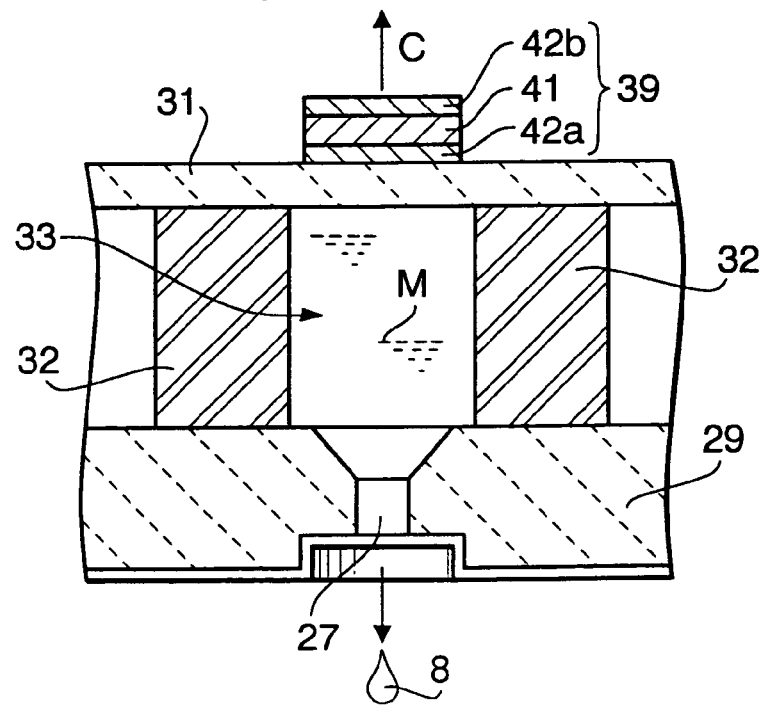
FIG. 1(B) is a sectional view taken along a line b—b of FIG. 1(A)

(1) Liquid Jetting Apparatus:

(i) Construction of Droplet Jet Head:

FIGS. 1(A) and 1(B) show a droplet jet head 22 used in the first embodiment. More particularly, FIG. 1(A) is a partially cut-away perspective view showing principal portions of the droplet jet head 22 used in the first embodiment, and FIG. 1(B) is a sectional view taken along a line b—b of the droplet jet head 22 shown in FIG. 1(A).

Figure 2A:
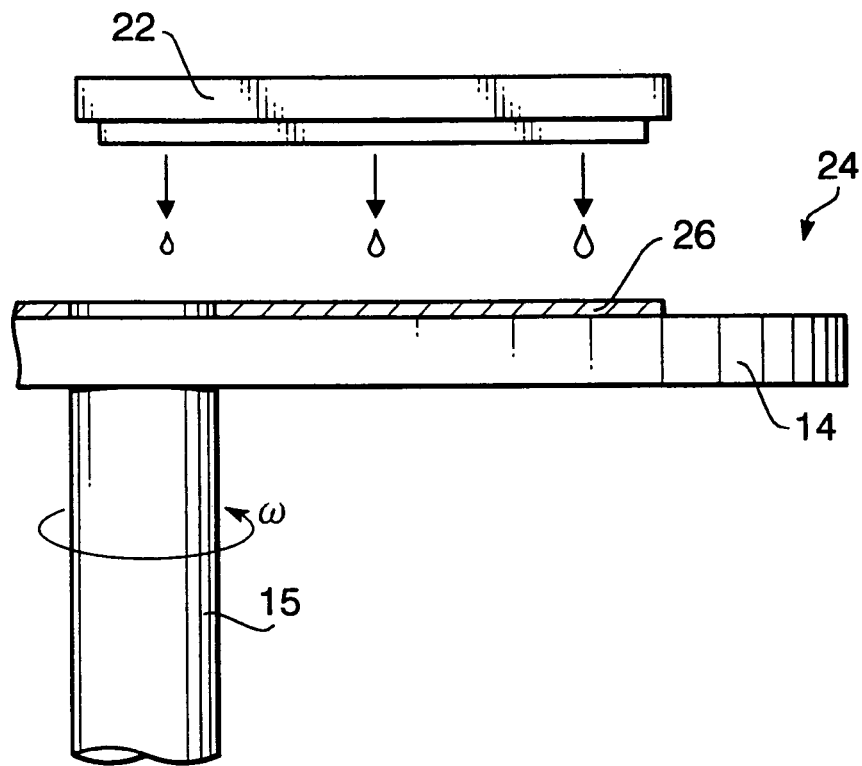
FIG. 2(A) is a partial cut-away side view showing principal portions of a spin coater constituting the liquid jetting apparatus according to the invention.
Figure 2B:
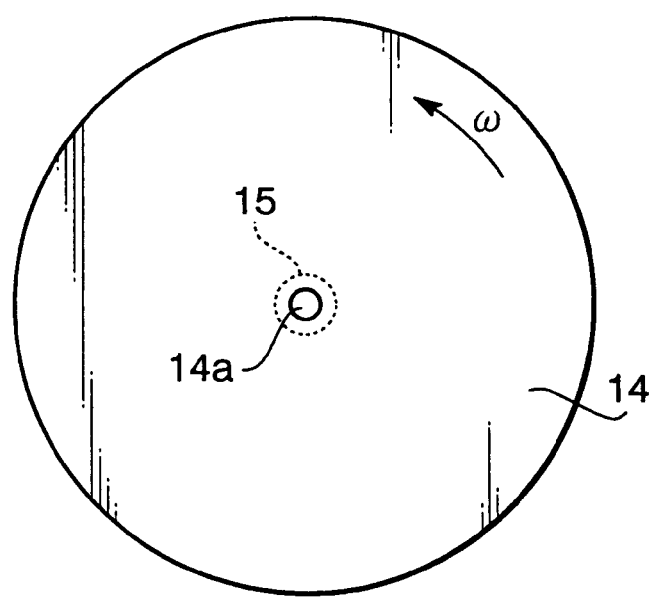
FIG. 2(B) is a plan view of a fitting plate.

A liquid jetting apparatus including the droplet jet head 22 has a spin coater 24, or the like, as shown in FIG. 2(A). A host computer controls both of them. Preferably, this droplet jet head 22 jets a plurality of liquids, that is, at least two kinds of liquids that are the same or different, from a corresponding nozzle train to apply on the substrate by an ink jet system using a piezoelectric device.

However, the jetting apparatus of the liquid according to the invention is in no way limited to such an ink jet system, but a liquid jetting apparatus by other system can also be used so long as it can sequentially jet a plurality of fine droplets. For example, the jetting apparatus of the invention may well be a liquid jetting apparatus by a so-called "heating system ink jet system" that jets ink, etc., by utilizing bubbles generated by heating.

The droplet jet head 22 includes, for example, a stainless steel nozzle plate 29, a vibration plate 31 so arranged as to oppose the nozzle plate 29 and a plurality of partition members 32 for bonding them together. Each partition member 32 defines a plurality of liquid storage chambers 33 and a liquid reservoir 34 between the nozzle plate 29 and the vibration plate 31. A plurality of liquid storage chambers 33 and the liquid reservoir 34 communicate with one another through a passage 38. A liquid feeder hole 36 is bored at a suitable position of the vibration plate 31, and a liquid feeder 37 is connected to this liquid feeder hole 36.

The liquid feeder 37 is an apparatus that feeds a resist material used as a liquid for photolithography, one of filter element materials (M) such as a filter element material (M) corresponding to an R pixel of RGB pixels or a filter element material (M) corresponding to a Y pixel of YMC pixels, and so forth, to the liquid feed hole 36. Therefore, the liquid so fed is charged into the liquid reservoir 34 and is from thence charged into the liquid storage chamber 33 through the passage 38.

The nozzle plate 29 that constitutes a part of the droplet jet head 22 is provided with nozzles 27a (FIG. 3) for spraying the liquid in the jet form from the liquid storage chamber 33. A plurality of nozzles 27a is aligned in a line to constitute a nozzle train 27. A liquid pressurization body 39 is fitted to a surface of the vibration plate 31 corresponding to the formation portion of the liquid storage chamber 33. The liquid pressurization body 39 includes a piezoelectric device 41 and a pair of electrodes 42a and 42b interposing the piezoelectric device 41.

When power is applied to the electrodes 42a and 42b, the piezoelectric device 41 undergoes deflection in such a fashion as to protrude outward as indicated by an arrow C and thereby increases a capacity of the liquid storage chamber 33. When the capacity of the liquid storage chamber 33 increases by the amount corresponding to the increment of the capacity, liquid such as the resist material or the filter element material (M) flows from the liquid reservoir 34 into the liquid storage chamber 33 through the passage 38.

On the other hand, when the supply of power to the piezoelectric device 41 is released, both piezoelectric device 41 and vibration plate 31 return to their original shapes, and the liquid storage chamber 33 returns to its original capacity, too. Therefore, the pressure of the liquid inside the liquid storage chamber 33 rises and the liquid such as the filter element material (M) inside the liquid storage chamber 33 is jetted as droplets 8 from the nozzle train 27. The droplet 8 can be stably jetted from the nozzle train 27 as fine droplets irrespective of the kind of the solvent, etc., contained in the liquid.

(ii) Number of Droplet Jet Heads:

At least one droplet jet head 22 may be disposed so as to correspond to the spin coater 24 shown in FIG. 2(A), but the liquid jetting apparatus according to the invention preferably has a plurality of droplet jet heads 22.

Figure 12:
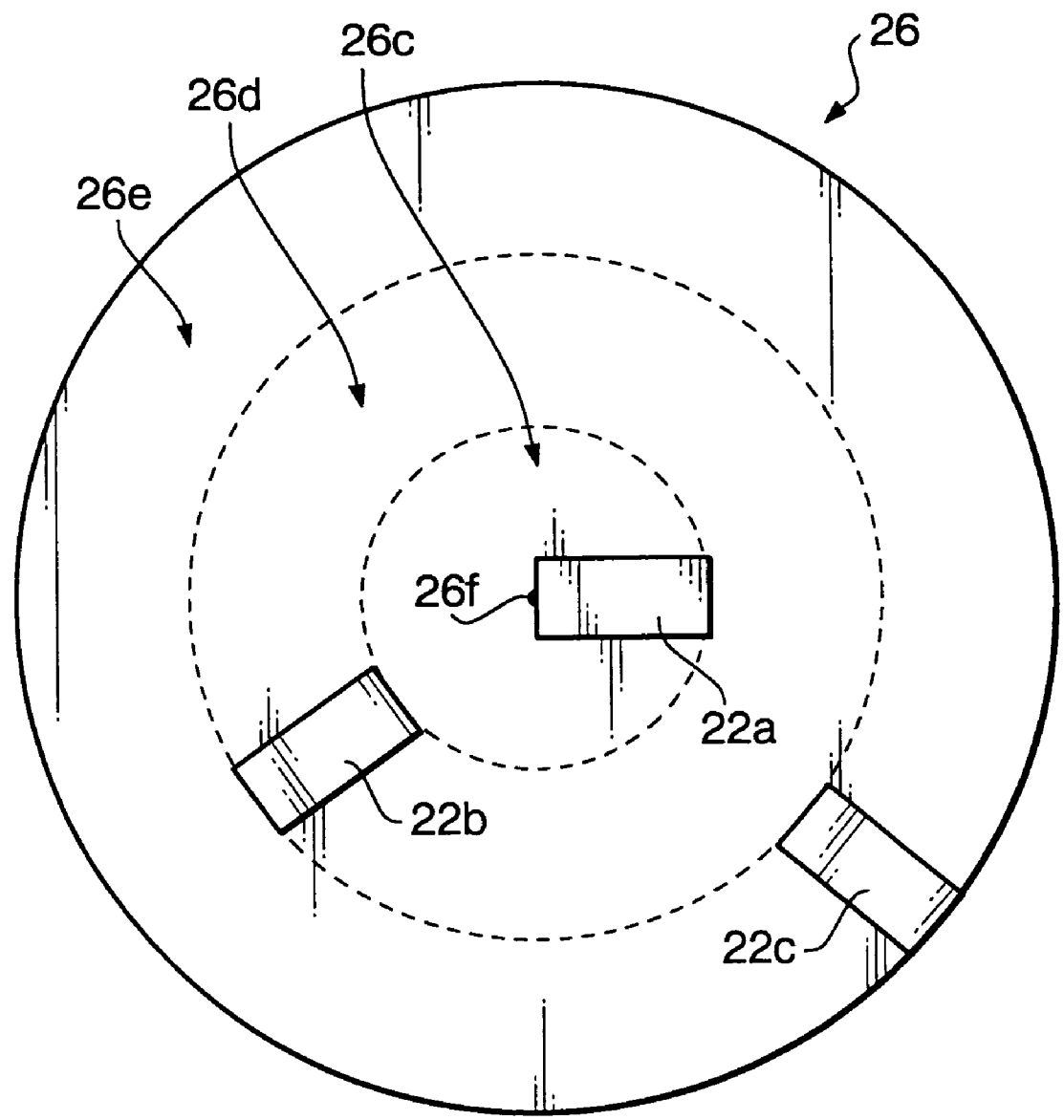
FIG. 12 is a plan view showing an example of a relational arrangement of three droplet jet heads and the substrate.

It is preferred in such a case to use separate droplet jet heads for the respective divided substrate regions to jet the liquid. Three droplet jet heads 22a, 22b and 22c are disposed, for example, as shown in FIG. 12 in such a manner as to cover the corresponding liquid jet regions. In other words, the droplet jet heads 22a, 22b and 22c preferably take charge of jetting the liquid to the respective regions 26c, 26d and 26e.

According to this construction, the region each droplet jet head 22a, 22b, 22c covers becomes small and the region of each droplet jet head is limited. Therefore, control of the jet amount of the liquid by each head can be finely controlled. Moreover, when a plurality of droplet jet heads is disposed, the region covered by one droplet jet head becomes smaller. Consequently, the occurrence of a non-coated portion of the liquid becomes smaller than when one droplet jet head covers the entire surface of the substrate 26.

Particularly in the case when the jet amounts of the liquid are remarkably different among the regions 26c, 26d and 26e, it is preferred to arrange a plurality of droplet jet heads that take charge of jetting the liquid, because individual control of the jet amount for each region becomes possible in comparison with the case where one droplet jet head 22 is used, and fine control of the jet amount becomes possible for each droplet jet head.

Figure 3:
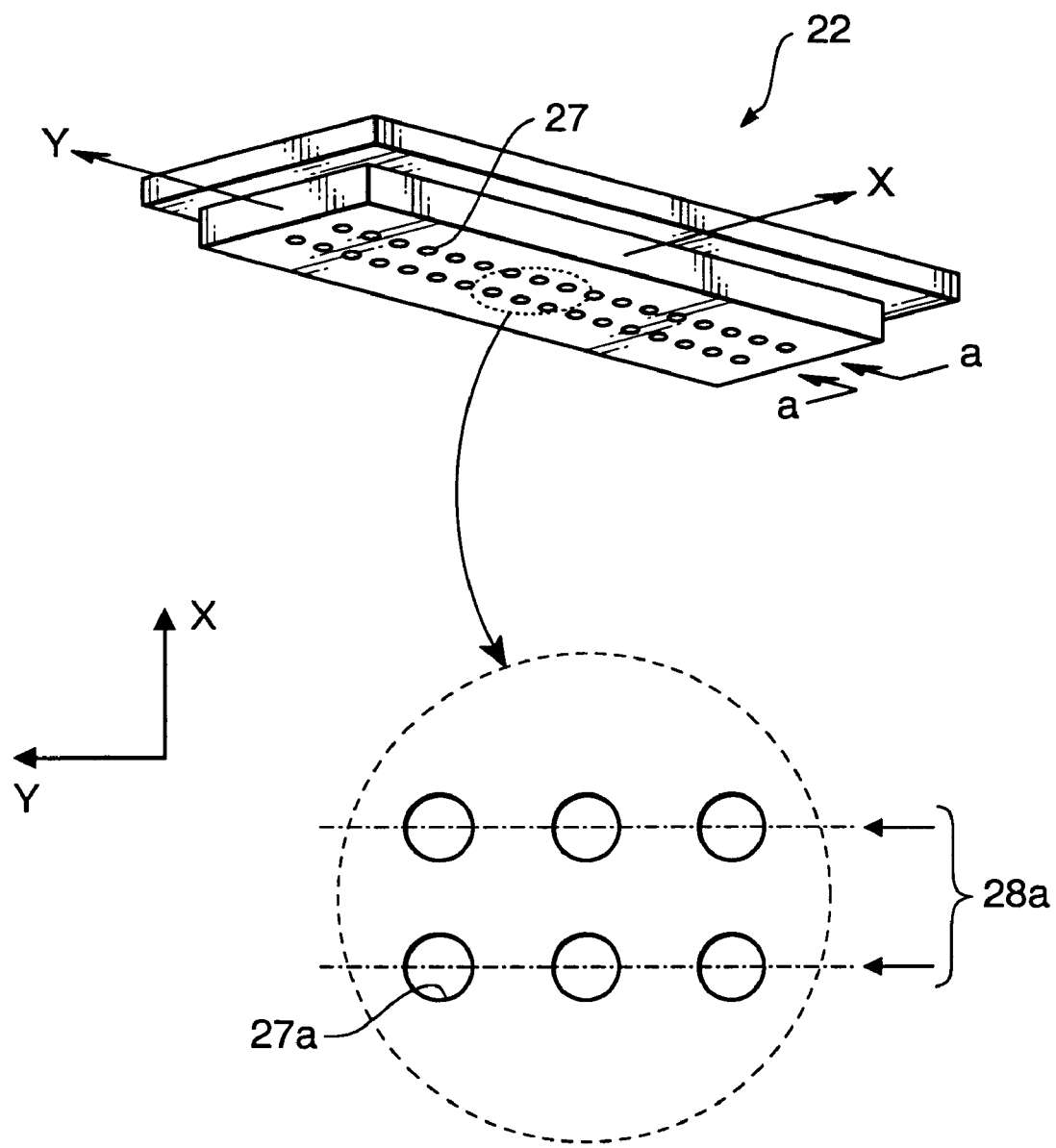
FIG. 3 is a perspective view and an enlarged view of the principal portions of the droplet jet head.

Preferably, the nozzle trains 27 corresponding to a plurality of liquids are respectively provided to the droplet jet heads 22a, 22b and 22c so as to use each of the droplet jet heads 22a, 22b, 22c as a plurality of droplet jet heads corresponding to each color filter ink of the RGB pixels or the YMC pixels as shown in FIG. 3 so that each ink corresponding to the RGB pixels or the YMC pixels can be jetted.

The reason is that by this configuration, fine plotting can be achieved by conducting a predetermined operation while controlling the operation of the droplet jet head corresponding to each liquid by the host computer.

Therefore, when three droplet jet heads 22a, 22b and 22c are provided in such a manner as to correspond to evaporation characteristics and the like of a plurality of liquids, it becomes easy to apply the liquid in such a manner that the first droplet jet heads 22a apply the liquid one time by one operation thereof, then the second droplet jet head 22b apply and superpose the liquid twice by similar operation thereof, and the third droplet jet heads 22c apply and superpose the liquid three times by similar operation thereof.

On the other hand, when one droplet jet head 22 is disposed, the jet amount of the liquid is preferably changed over the entire coating region in consideration of the number of nozzles 27a, the size of the nozzle train 27 and the size of the coating region of the substrate 26, by moving the droplet jet head 22 relative to the substrate 26, whenever necessary.

Also, when the number of the droplet jet head 22 is one, it is preferred that the nozzle trains 27 corresponding to a plurality of the liquid are arranged. In this way, the overall size of the liquid jetting apparatus can be rendered compact. Compared with the three droplet jet heads 22a, 22b and 22c, in the construction in which three nozzle trains 27 are provided to one droplet jet head 22 to correspond to three kinds of liquids, the occupying area of the droplet jet head 22 can be reduced, and the occupying area of a driving device and the like corresponding to the droplet jet head 22 can be reduced, too.

(iii) Nozzle Train:

The nozzle train 27 in the liquid jetting apparatus according to the invention is preferably constituted in such a fashion that the jetted droplets 8 are applied onto the disc-like substrate 26 fixed on the spin coater 24 as shown in FIG. 2(A). In other words, it is preferred that the nozzle train 27 has a plurality of small nozzles 27a having a diameter of about 0.02 to 0.1 mm and a plurality of lines of each nozzle 27a is arranged per unit length, as shown in FIG. 3.

The nozzle train 27 can jet the liquid, flowing in from the direction indicated by an arrow "a" in the drawing, as a fine droplet from each nozzle 27a by means of the piezoelectric device 41. The liquid jetting apparatus according to the invention, the number of the nozzle 27a is not limited to a plurality of numbers but may be one.

(iv) Rotation Means:

It is preferred to rotate the substrate 26 at a high speed by using rotation means such as the spin coater 24. In such a case, the spin coater 24 is preferably disposed below the droplet jet head 22 in such a fashion as to be capable of covering the moving range of the droplet jet head 22. That is, the spin coater 24 includes a rotating shaft 15 and a fitting plate 14 fixed to the upper part of the rotating shaft 15 as shown in FIG. 2(A). The fitting plate 14 rotates at a predetermined angular velocity "ω," with a center portion 14a as the center corresponding to the fixing portion of the rotating shaft 15, under a steady state other than immediately after the start and immediately before finish of rotation.

Figure 4:
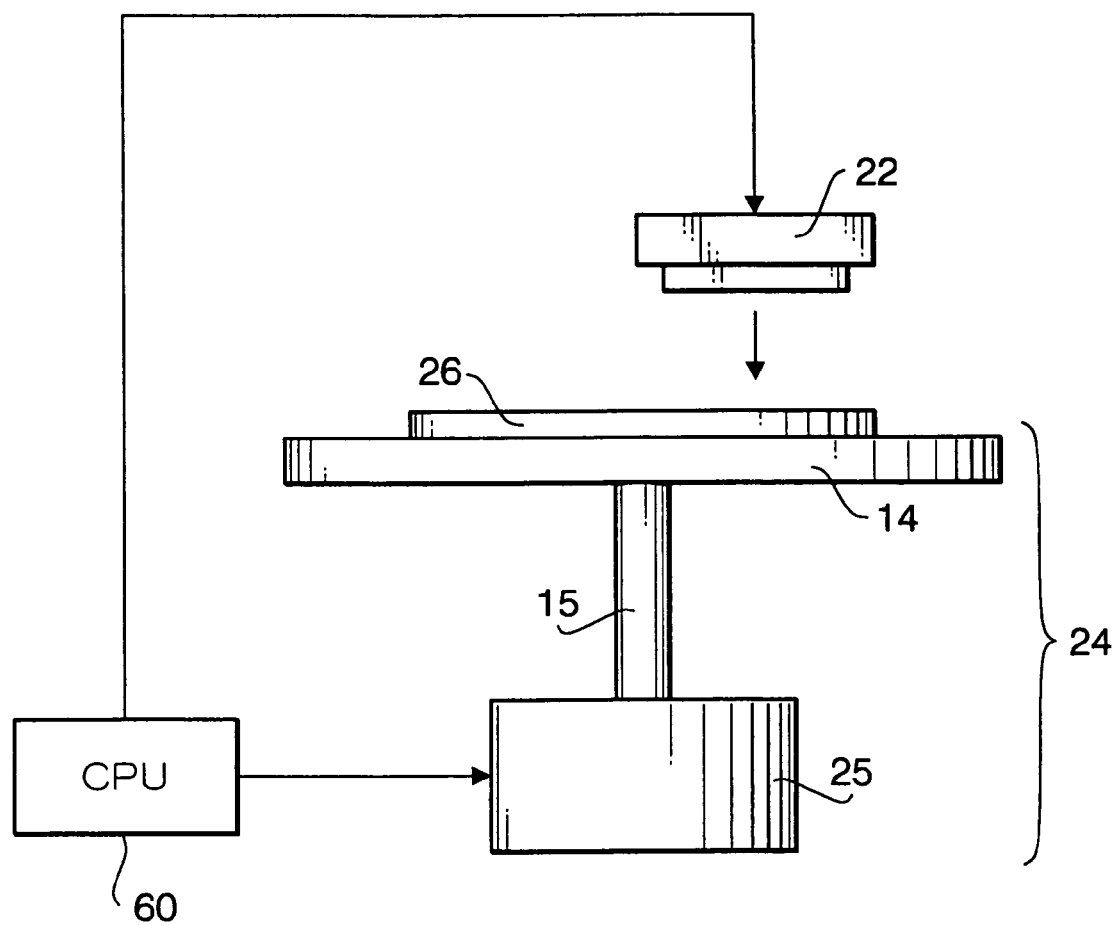
FIG. 4 is a side view of the liquid jetting apparatus according to the invention and its accompanying block circuit diagram.

The angular velocity "ω" is within a range of 10 to 10,000 rpm, for example. When the substrate 26 is fixedly arranged on the upper surface of the fitting plate 14, the substrate 26 rotates at the predetermined angular velocity "ω" with the center portion 14a as the center. The fitting plate 14 is preferably driven for rotation while a driving mechanism 25 including a motor, or the like, operates under control of the host computer 60 as shown in FIG. 4. Incidentally, the droplet jet head 22 preferably moves and operates in accordance with the control of the host computer 60.

Figure 6:
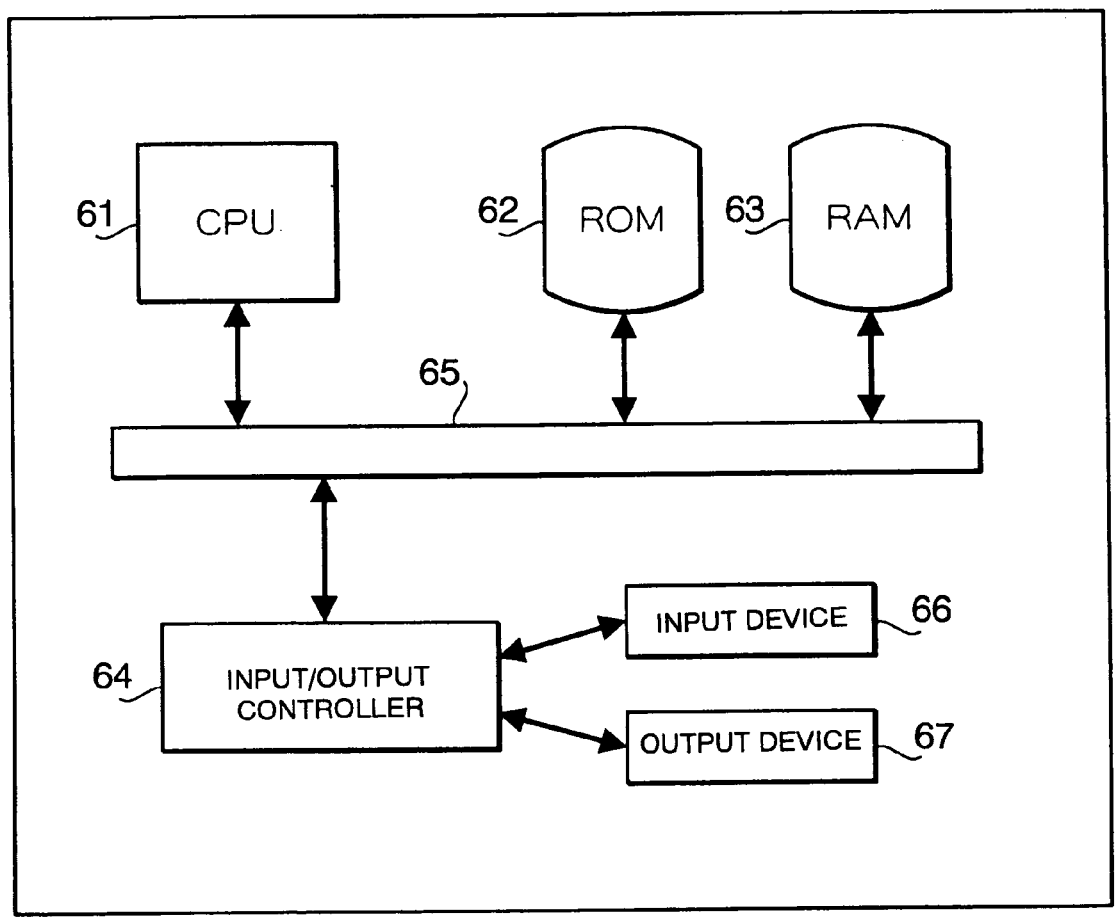
FIG. 6 is a block diagram showing a construction of a host computer.

(v) Host Computer:

In the host computer 60, input devices 66 such as a keyboard and a mouse and output devices 67 such as a display and a printer are preferably connected to a computer main body as shown in FIG. 6.

FIG. 6 is a block diagram showing the construction of the host computer 60. The host computer 60 preferably includes a CPU 61, an ROM 62, an RAM 63 and an input/output controller 64 inside the main body thereof, and all of which are connected to one another through a bus 65. The CPU 61 preferably operates in accordance with a program stored in the ROM 62, controls the operations of the spin coater 24 and of the droplet jet head 22 and functions as jet amount adjustment means as the feature of the invention. The ROM 62 preferably stores the control program executed by the CPU 61. The RAM 63 preferably stores the data and the like processed by the CPU 61 temporarily, and stores data necessary for the control of the CPU 61 permanently. The input/output controller 64 preferably controls input/output of the data between the input device 66 and the output device 67.

Figure 5A:
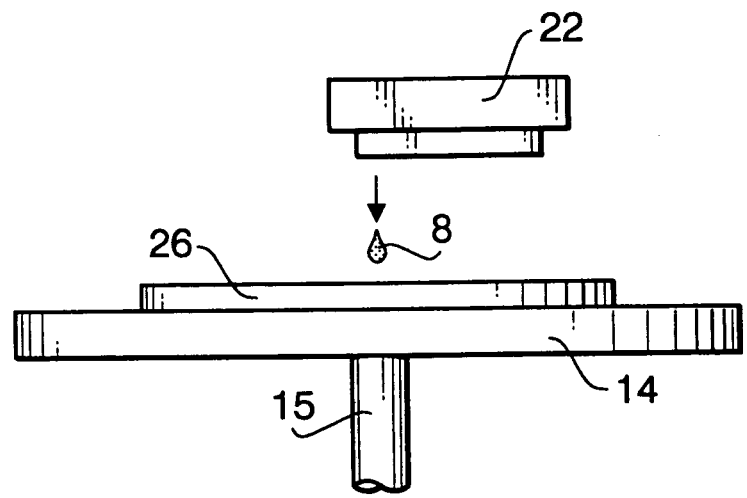

(2) Jetting Method of Liquid:

In the first embodiment, the droplet jet head 22 jets the droplet 8 to the substrate 26 rotated by the spin coater 24 or to the substrate 26 that has already rotated, as shown in FIG. 5(A). The droplet 8 is preferably applied drop-wise to the substrate 26 arranged below the droplet jet head 22.

Figure 5B:
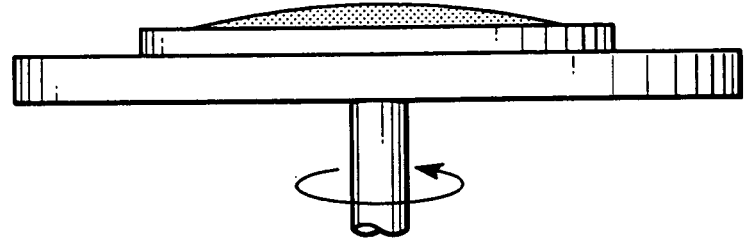
Figure 5C:
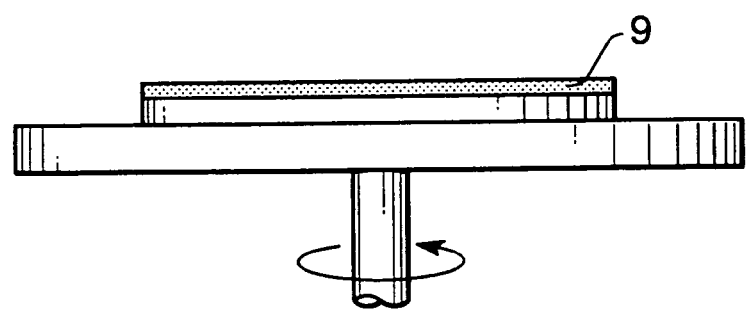

A process step is preferably secured by diffusing the liquid in a predetermined direction or in a circumferential direction after the liquid is applied from the nozzle of the droplet jet head 22 to the substrate so as to diffuse the applied liquid. For example, the droplets 8 are diffused on the surface of the substrate 26 by means of the centrifugal force of the spin coater and the like, or by the push force of the roller and the like applied to the substrate 26 as shown in FIG. 5(B), thereby forming the film 9 on the substrate 26 as shown in FIG. 5(C).

However, when the centrifugal force scatters a part of the droplets 8 to the surrounding portion and the amount of the droplets 8 applied is not suitable or is the same irrespective of the coating position of the substrate 26, the possibility occurs that the film thickness of the film formed on the substrate 26 does not become uniform but invites variance because some liquid has a high viscosity.

Therefore, it is preferred in the first embodiment to vary and adjust the jet amount of the liquid in the following ways to avoid scattering of the droplets 8, variance of the film resulting from the differences of the substrate shape and the liquid characteristics, and waste of the liquid.

Figure 7A:
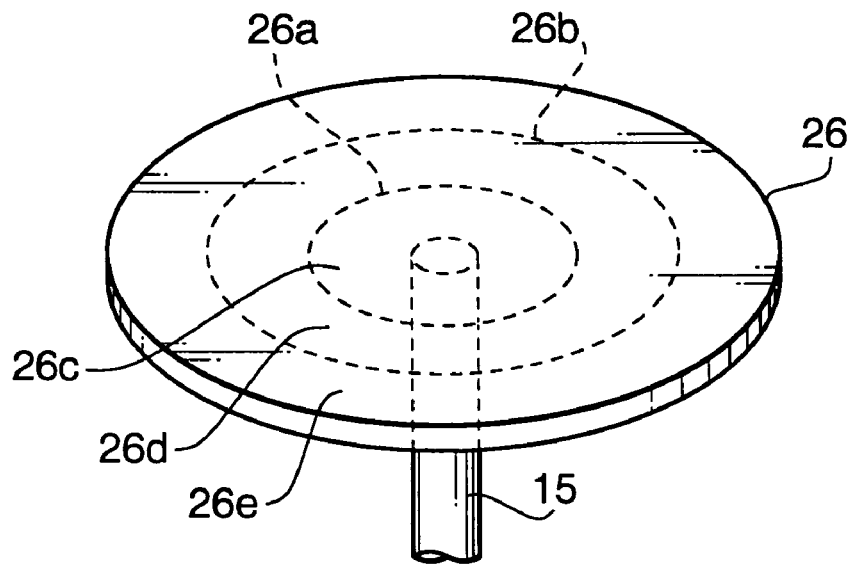
FIG. 7(A) is a perspective view showing coating regions of divided substrates.

(i) First Example of Adjustment Method of Jet Amount:

To adjust the jet amount by the liquid jetting apparatus, it is preferred to divide the liquid coating region (hereinafter called "coating region") of the substrate 26 into three regions 26c, 26d and 26e, for example, with two circumferential boundaries or circumferences 26a and 26b having the centers thereof at the rotating shaft 15 of the spin coater 24, as the boundaries as shown in FIG. 7(A). The jet amount of the liquid is preferably adjusted so that the amount becomes progressively greater for the regions 26c, 26d and 26e, or in other words, the jet amount becomes greater in the outside regions 26d and 26e than in the inside region 26c close to the rotating shaft 15, as shown in FIG. 7(B) for the following reason.

When the jet amount of the liquid is adjusted in this way, a greater amount of the liquid can be applied to the outside regions, which the liquid is otherwise more difficult to reach than to the inside region. Therefore, even when the liquid does not smoothly spread on the surface of the substrate 26 due to its viscosity, etc., the liquid applied drop-wise can be uniformly applied to the entire surface of the substrate.

Figure 7B:
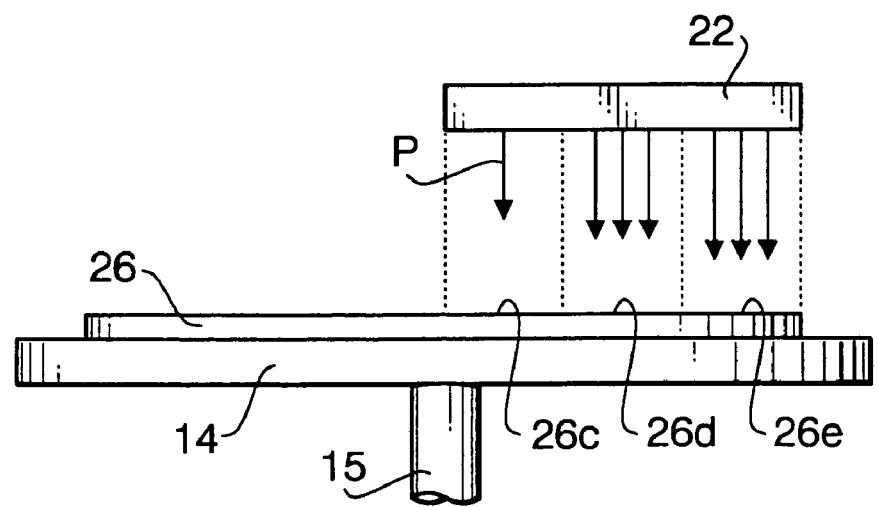
FIG. 7(B) is a front view showing a state where the liquid is jetted to the coating regions of the divided substrates while a jet amount is varied.

Incidentally, the number of arrows "p" and their length in FIG. 7(B) represent the amounts of the liquid jet amounts. In other words, the greater the number of arrows "p" and the greater the length, the greater becomes the jet amount.

Figure 11A:
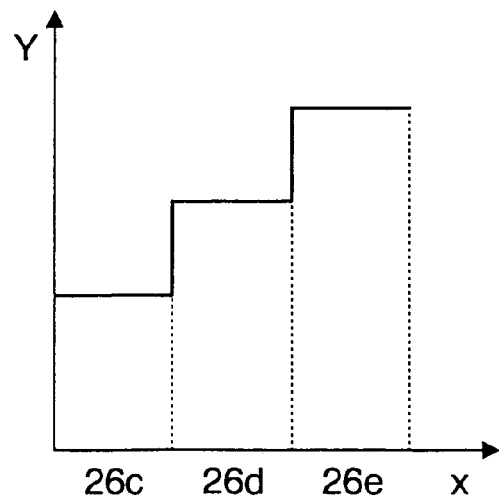
FIG. 11(A) is a graph showing the relation between the distance x from the center of revolution of the substrate and the jet amount Y of the liquid.
Figure 11B:
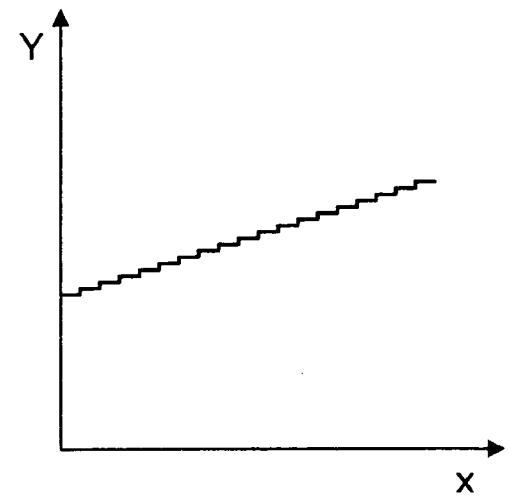
FIG. 11(B) is a graph showing still another example of the relation between the distance x and the jet amount Y.

Though the coating region of the substrate 26 is divided into three regions by way of example, the coating region may well be divided into at least two regions and may be divided into three or more. When the coating region is divided into three or more regions, it is preferred to quantitatively and step-wisely change the jet amount Y of the liquid from the inside region to the outside region as shown in FIG. 11(A), for example. The coating region may further be divided as minutely as possible to increase the number of divisions so that the jet amount Y of the liquid continuously increases as shown in FIG. 11(B). In either case, the coating region may be divided in consideration of the characteristics of the liquid and the angular velocity of the rotation of the fitting plate 14.

(ii) Second Example of Adjustment Method of Jet Amount:

When the jet amount of the liquid is adjusted, the host computer 60 shown in FIG. 6 preferably controls the operation of the droplet jet head 22. In other words, it is preferred to change over the ON/OFF timing of the supply of power to the piezoelectric device 41 for each nozzle 27a of the droplet jet head 22 in accordance with the program stored in the ROM 62 and to adjust the jet amount of the liquid.

When the jet amount of the liquid is adjusted, it is preferred to take into consideration the characteristics such as the viscosity and density of the liquid to be applied or the evaporation rate and the like of the solvent contained in the liquid, and the angular velocity of the rotation of the fitting plate 14 of the spin coater 24.

The reason is that the degree of spreading of the liquid on the substrate varies depending on its characteristics and when the viscosity of the liquid is high, for example, the liquid is hardly spread but likely to stay at the center of the substrate. Even when the characteristics remain the same, the degree of spreading of the liquid may also vary if the angular velocity of the spin coater 24 varies because the magnitude of the centrifugal force varies. Preferably, the jet amount of the liquid is adjusted in accordance with such a difference to make the jet amount appropriate.

Figure 8A:
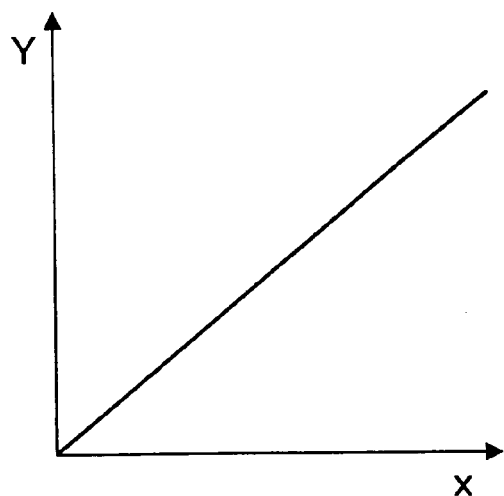
FIG. 8(A) is a graph showing the relation between a distance x from a center of revolution of the substrate and a jet amount Y of the liquid.
Figure 8B:
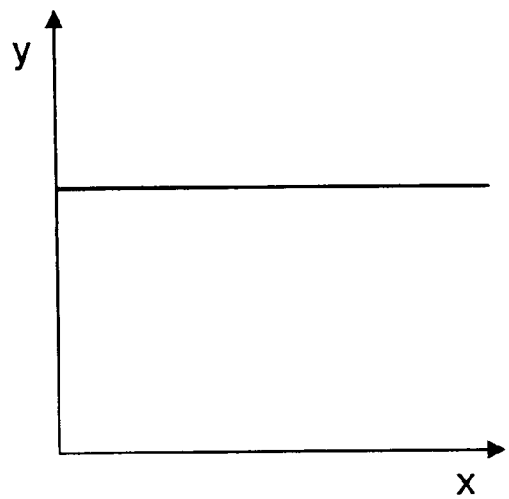
FIG. 8(B) is a graph showing an example of the relation between the distance x and a change ratio y of the jet amount Y to the distance x.

(iii) Third Example of Adjustment Method of Jet Amount:

When the jet amount of the liquid is adjusted, it is also preferred to increase the jet amount "Y" of the liquid in proportion to a specific position of the substrate 26 such as the distance "x" from the center of rotation (from the center portion 14a, for example) of the substrate 26. The relation between the jet amount "Y" and the distance "x" in this case describes a line graph having predetermined orientation as shown in FIG. 8(A). The relation between the change ratio "y" of the jet amount "Y" to the distance "x" and the distance "x" describes a line parallel to the x-axis as shown in FIG. 8(B).

Figure 9A:
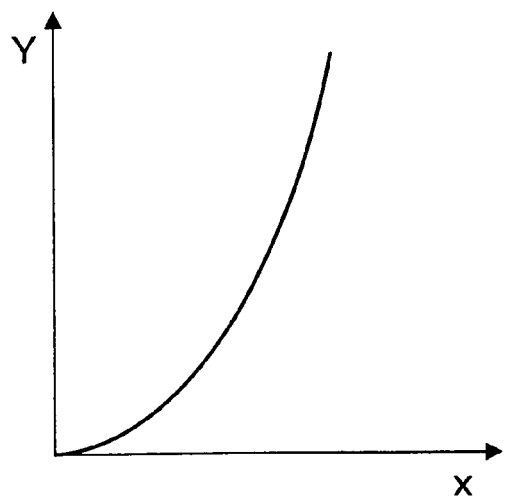
FIG. 9(A) is a graph showing the relation between the distance x from the center of revolution of the substrate and the jet amount Y of the liquid.
Figure 9B:
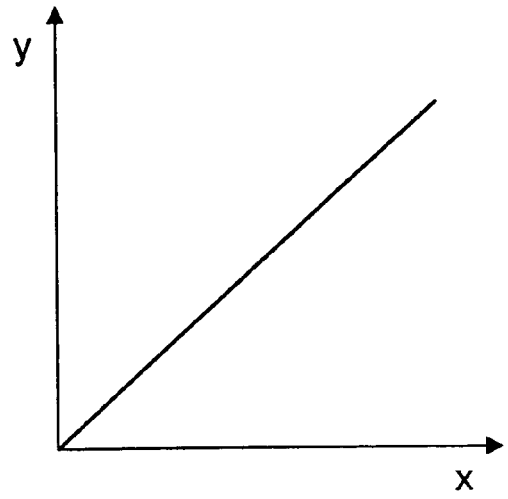
FIG. 9(B) is a graph showing another example of the relation between the distance x and a change ratio y of the jet amount Y to the distance x.

It is further preferred to increase the jet amount "Y" of the liquid in proportion to the square of the distance "x." In this case, the relation between the jet amount "Y" and the distance "x" describes a parabola as shown in FIG. 9(A), and the relation between the change ratio "y" of the jet amount "Y" to the distance "x" and the distance "x" describes a line graph having predetermined orientation where the change ratio "y" is proportional to the distance "x" as shown in FIG. 9(B).

Figure 10A:
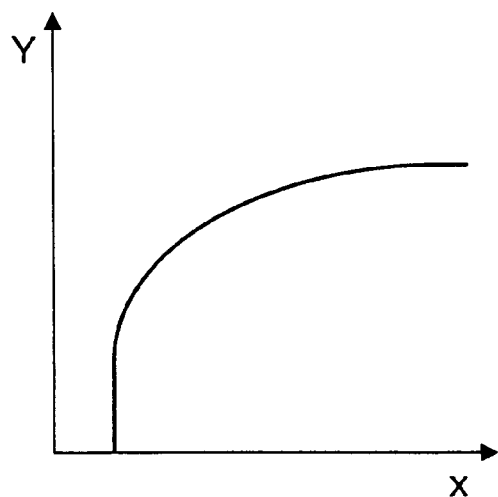
FIG. 10(A) is a graph showing the relation between the distance x from the center of revolution of the substrate and the jet amount Y of the liquid.
Figure 10B:
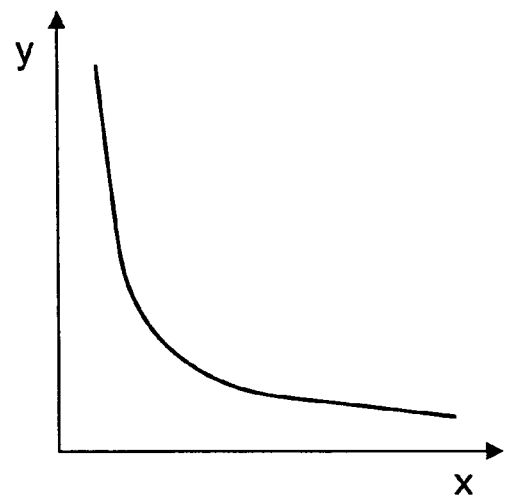
FIG. 10(B) is a graph showing still another example of the relation between the distance x and a change ratio y of the jet amount Y to the distance x.

Furthermore, the jet amount "Y" of the liquid may be increased as a logarithm (Log x) to the distance "x." In this case, the relation between the jet amount "Y" and the distance "x2" describes a curve as shown in FIG. 10(A), and the relation between the change ratio "y" of the jet amount "Y" to the distance "x" and the distance "x" describes a curve in which the change ratio "y" is inversely proportional to the distance "x" as shown in FIG. 10(B).

(iv) Fourth Example of Adjustment Method of Jet Amount:

To adjust the jet amount of the liquid, it is preferred to control the supply of power to the piezoelectric device 41 so as to vary the jet amount of each nozzle 27a while the position of each droplet jet head 22 is kept stationary. In this case, the droplet jet head 22 preferably has the nozzle train 27 having a plurality of nozzles 27a.

On the other hand, it is also preferred to move the droplet jet head 22 to vary its position relative to the substrate 26 and to thereby vary the jet amount of the liquid. In this case, the droplet jet head 22 preferably has only one nozzle 27a.

Figure 14A:
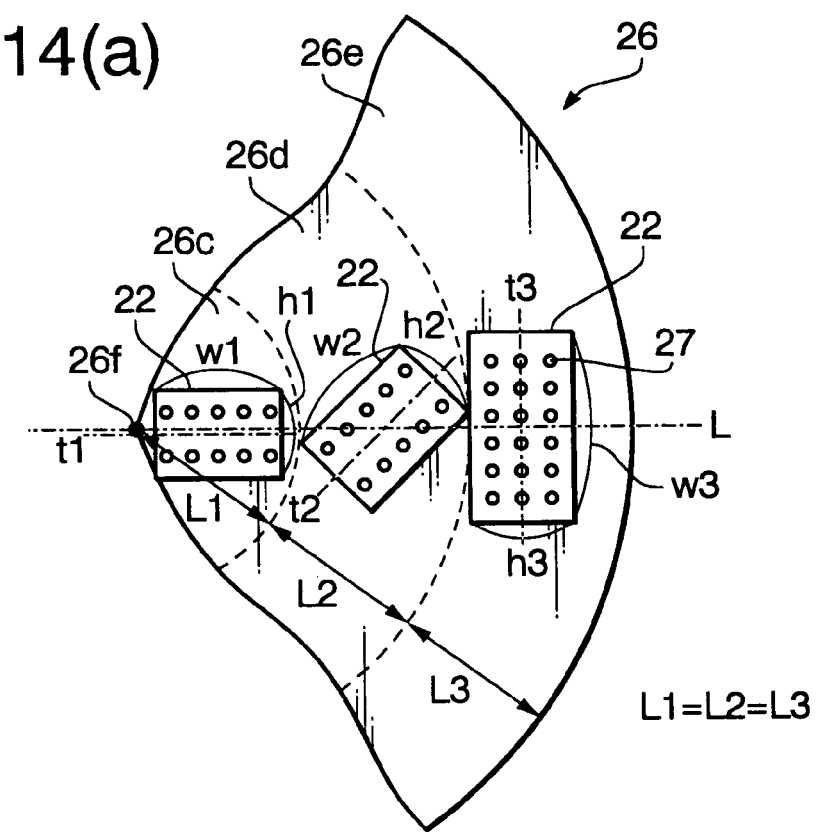
FIGS. 14(A) and 14(B) show an example of the relational arrangement between each droplet jet head and the substrate when the three droplet jet heads are arranged while angles of orientations are changed.
Figure 14B:
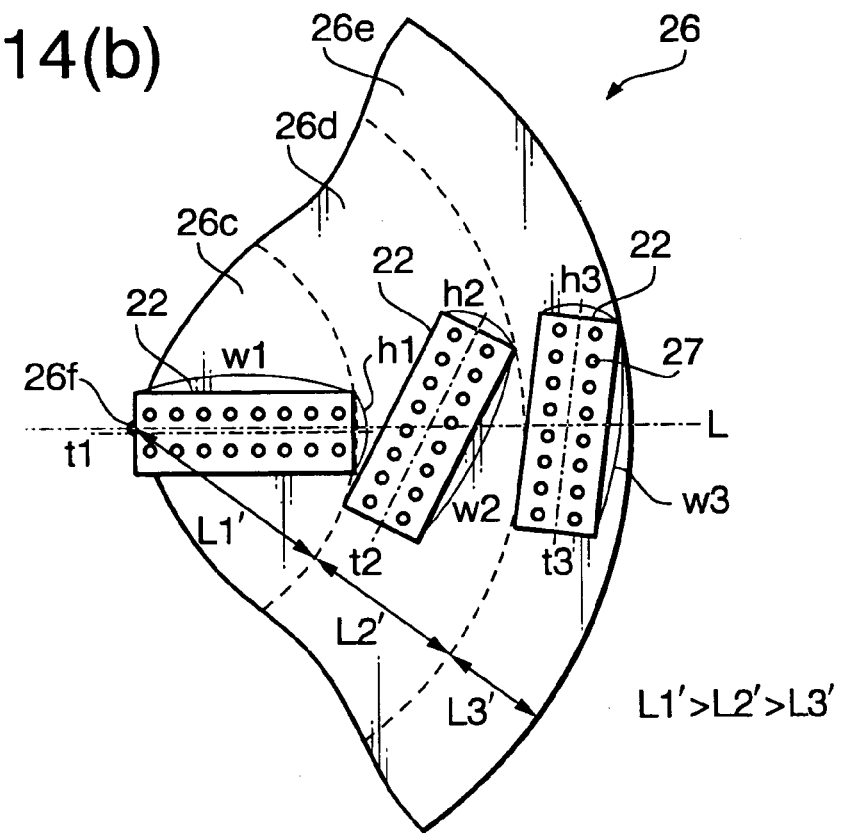

(v) Fifth Example of Adjustment Method of Jet Amount:

To adjust the jet amount of the liquid, it is preferred to vary the angles of orientation of the nozzle trains 27 of a plurality of droplet jet heads 22 relative to the radial direction of the substrate 26, that is, to vary the arrangement directions (t1, t2 and t3) of each nozzle trains 27 relative to the axis L in the radial direction of the substrate 26 in accordance with the distance from the center of rotation 26f of the substrate 26 as shown in FIGS. 14(A) and 14(B).

This is because when the angles of orientation of a plurality of nozzle trains 27 are varied, the number of nozzle trains 27 arranged per unit width of the substrate 26 changes and hence the number of nozzle holes 27a changes. Consequently, variance of application of the liquid can be eliminated, and adjustment itself of the jet amount of the liquid corresponding to the position of the substrate 26 can be mitigated.

For example, three droplet jet heads 22 having mutually different widths (W1 to W3), mutually different lengths (h1 to h3) and mutually different numbers of nozzle trains 27 (two or three) are prepared as shown in FIG. 14(A) and are arranged from the center of rotation 26f towards the outside, respectively. For example, it is preferred to set the angle of orientation of the nozzle train 27 close to the center of rotation 26f to 0°, the angle of orientation of the intermediate nozzle train 27 to 45°, and the angle of orientation of the nozzle train 27 at the remotest position from the center of rotation 26f to 90°.

In the case of the nozzle train 27 close to the center of rotation 26f, two nozzle holes existing in the rotating direction play the role of applying the liquid to the unit width of the substrate 26. In the case of the nozzle train 27 away from the center of rotation 26f, however, six nozzle holes play the role of applying the liquid. Thus, variance of application of the liquid can be reduced and adjustment of the jet amount of the liquid can be mitigated.

Incidentally, the lengths (L1, L2 and L3) in the radial direction in the regions 26c, 26d and 26e of the substrate 26 are equal to one another in this case. Therefore, in the case of the nozzle train 27 away from the center of rotation 26f, the portion at which the nozzle train (nozzle holes) does not exist on the substrate occurs assuming that the position of the nozzle train 27 in the transverse direction does not move. However, when the number of nozzle trains 27 away from the center of rotation 26f is increased, for example, the liquid applied becomes more likely to be spread outward and eventually, a film having a uniform thickness can be formed.

Three droplet jet heads 22 each having an equal width (W1 to W3), an equal length (h1 to h3) and an equal number (2) of nozzle trains 27 are prepared as shown in FIG. 14(B) and are arranged from the center of rotation 26f toward the outside, respectively. It is preferred to set the angle of orientation of the nozzle train 27 close to the center of rotation 26f to 0°, the angle of orientation of the intermediate nozzle train 27 to 60° and the angle of orientation of the nozzle train 27 at the remotest position from the center of rotation 26f to 85°, for example.

In this case, because the length (L1, L2 and L3) in the radial direction of the regions 26c, 26d and 26e of the substrate 26 becomes progressively smaller toward the outside, the portion at which the nozzle train (nozzle holes) does not exist on the substrate can be reduced and adjustment of the jet amount of the liquid can be mitigated.

The film having a uniform film thickness can be formed on the substrate when the liquid is applied by use of a plurality of droplet jet heads 22. To further reduce the film thickness distribution of the film, leveling may be applied so as to reduce concavo-convexities of the resulting film and to render the film smooth.

(vi) Sixth Example of Adjustment Method of Jet Amount:

To adjust the jet amount of the liquid, it is preferred to vary the jet amount with reference to a jet amount per unit area on the surface of the substrate 26 and per unit time (hereinafter this jet amount is referred to "unit jet amount").

It is of course possible to vary the jet amount per unit area on the surface of the substrate 26 while the jet amount from each nozzle 27a per unit time is kept unvaried. However, control can be made more minutely than in this construction when the jet amount from each nozzle 27a per unit time is taken into consideration or in other words, when the jet amount is varied in accordance with the position on the substrate surface (such as the distance from the center) and with time. Therefore, wasting of the liquid can be further saved and a film having a uniform thickness can be formed.

The unit jet amount is preferably varied in accordance with the characteristics of the liquid to be applied by taking the characteristics into consideration. For example, even when the jet amount is the same and the angular velocity of the fitting plate 14 of the spin coater 24 is the same, too, the degree of spreading of the liquid on the substrate varies depending on the characteristics of the liquid. The characteristics include, for example, the viscosity and the density of the liquid, the evaporation rate of the solvent, thixotropy, and so forth.

(3) Kind of Liquid, Coating Material and Substrate:

The kind of the liquid is not limited, in particular. Examples of the liquid include a resist material, an orientation film material, pigment ink, dye ink, color filter ink (called also "filter element material"), an electro-luminescence material (inclusive of a positive hole transportation material and electron transportation material), a plasma light emission material, and so forth. In the case of the resist material and the orientation film material, in particular, the film thickness distribution must be generally kept within ±2%. Therefore, they are suitable for the liquid as the object of the jetting method of the invention.

It is preferred to select appropriately a plurality of kinds of liquids and to decide the amount of the solvent and the like so that the viscosity of the solution falls within a range of 1 to 30 mPa·s (at a measurement temperature of 25° C.; hereinafter the same), for example. When the viscosity of the solution is less than 1 mPa·s, film formation of the coating material becomes substantially difficult. When the viscosity of the solution exceeds 30 mPa·s, on the other hand, clogging of the nozzles is likely to occur and the coating material having a uniform thickness cannot be formed easily in some cases.

To keep good balance between film formability of the coating material and uniformity of the film thickness, it is therefore preferred to appropriately select a plurality of kinds of liquids and the like and to keep the viscosity of the solution within a range of 2 to 10 mPa·s, more preferably within a range of 3 to 8 mPa·s.

Preferably, the viscosity of the solution of a plurality of liquids is appropriately selected in accordance with the application of the coating material. To form a color filter as will be described later, for example, the viscosity of the solution is preferably kept within a range of 6 to 8 mPa·s because a thick film is desired from the aspect of color purity.

Products having the film formed by applying the liquid to the substrate are not limited. Examples include a later-appearing color filter obtained by applying color filter ink, a light emission layer in an electro-luminescence apparatus, a light emission medium in a plasma display panel, a resist film and an orientation film in a liquid crystal display device, and so forth. Materials of the substrate to which the liquid is applied, and the application of the substrate, are not particularly limited, either. Examples include a polyester film, a polysulfone film, a polypropylene film, a cellulose acetate film, a TAC film, a glass substrate, a ceramic substrate, and so forth.

The thickness and shape of the substrate itself is not limited. For example, the thickness may be within a range of about 10 In to 15 mm. The shape may be circular or rectangular. For example, it is possible to use a phase change type optical disk of polycarbonate having a diameter of about 130 mm as the substrate and a UV curing solution as the liquid, to form a protective film on a vacuum-deposited metal vacuum deposition surface, formed on the surface of the substrate by the coating method of the liquid described above.

Second Embodiment

Next, the second embodiment of the invention related to a liquid jetting apparatus will be explained. The liquid jetting apparatus according to the second embodiment jets a liquid and applies it to a substrate. The jetting apparatus includes a droplet jet head having a nozzle and jet amount adjustment means, wherein the jet amount adjustment means controls the jet amount of the liquid to any one of at least two divided regions such that it is greater than a jet amount to the other divided regions when a liquid coating region of a substrate is divided into at least two regions.

Figure 15:
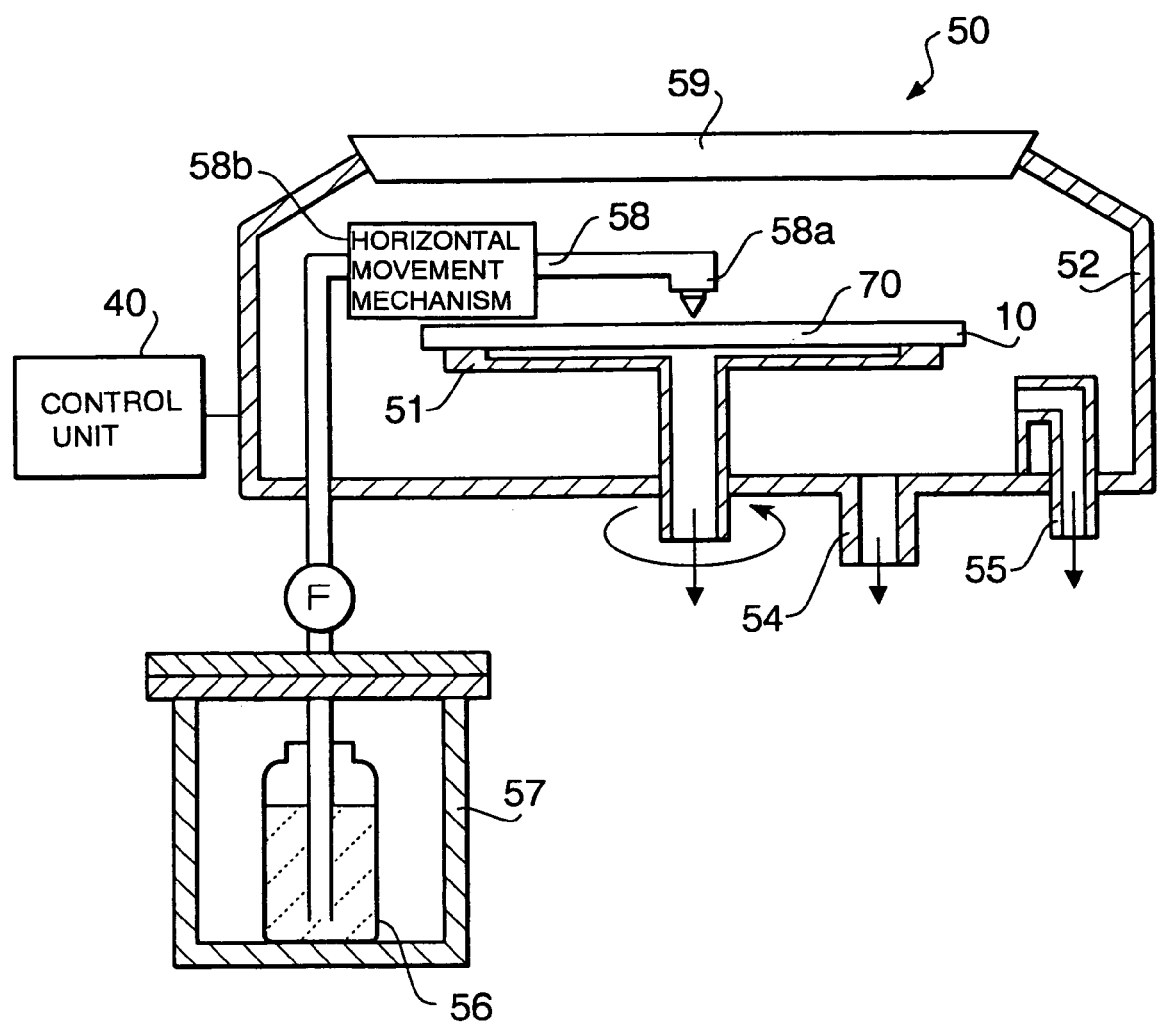
FIG. 15 is a sectional view showing a liquid jetting apparatus according to a second embodiment of the invention.

FIG. 15 is a sectional view showing the outline of this liquid jetting apparatus 50. The liquid jetting apparatus 50 is so constituted as to apply drop-wise the liquid from a droplet jet head 58 having a nozzle 58a to a glass substrate 10. Incidentally, the following explanation will be primarily given on portions different from the first embodiment and the explanation of the common portions will be omitted or simplified.

First, referring to FIG. 15, the liquid jetting apparatus 50 includes a sample table 51 that rotates the glass substrate 10 while applying a vacuum to the substrate 10 to secure it in place, a casing 52 for accommodating the apparatus 50 as a whole, a waste liquid pipe 54 for recovering the liquid scattering with the rotation of the sample table 51, an exhaust pipe 55 for exhausting the inside of the apparatus, a liquid container 56 for storing the liquid such as a resist solution, a pressurization tank 57 for accommodating the liquid container 56, a droplet jet head 58 having a nozzle 58a for applying drop-wise the liquid to the glass substrate 10 and a horizontal movement mechanism 58b for horizontally moving the nozzle 58a and a cover 59. Preferably, a control unit 40 functioning as jet amount adjustment means controls the overall operation of the jetting apparatus 50.

Figure 16:
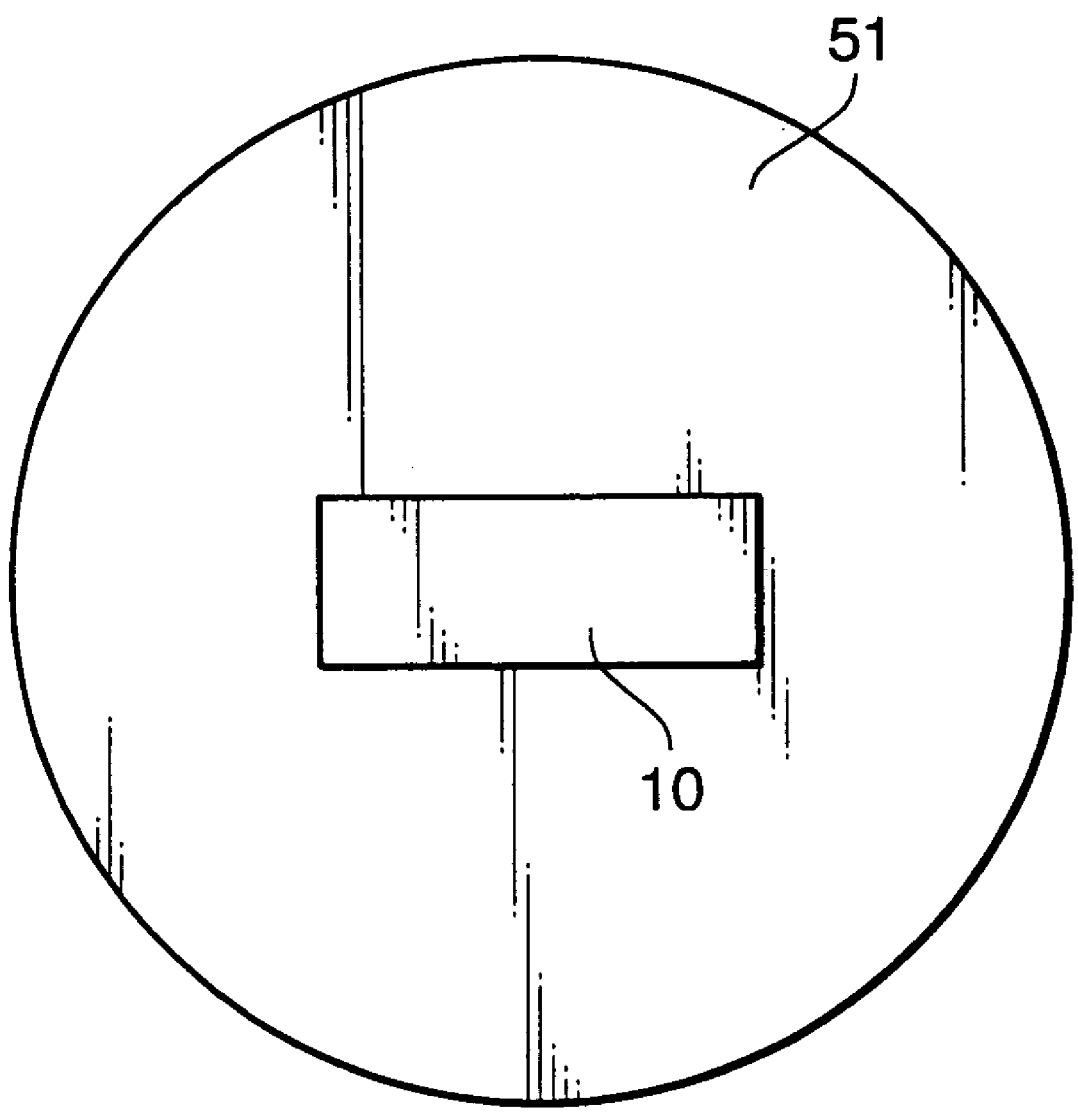
FIG. 16 is a plan view showing an example of a sample table.

The liquid jetting apparatus 50 shown in FIG. 15 vacuum sucks and fixes the glass substrate 10. However, it is also possible to arrange a chuck at the center of the sample table 51 and to fix the glass substrate 10 to this chuck as shown in FIG. 16.

The liquid jetting apparatus 50 preferably applies drop-wise (partly inclusive of spraying) the liquid (such as a resist solution) from the nozzle 58a to the glass substrate 10 fixed at the center of the sample table 51. The liquid jetting apparatus 50 has its feature in that the droplet jet head 58 operates in accordance with control of the control unit 40 to change its position relative to the glass substrate 10, and to vary the jet amount so that the jet amount of the liquid jetted from the nozzle 58a becomes greater to an outside region than to an inside region when the coating region of the glass substrate 10 is divided into two regions by a circle whose center is the rotating shaft of the sample table 51, i.e., the inside region close to the rotating shaft and the outside region away from the rotating shaft.

This is because this construction can apply a greater amount of the liquid to the outside region, in which the fluid cannot easily spread on the surface of the glass substrate 10, than to the inside region. Therefore, even when the liquid cannot easily spread on the surface of the glass substrate 10, the liquid can uniformly spread on the entire surface and forms a film 70 (such as a thin resist film) having a uniform film thickness. Moreover, because the liquid discharged from the waste liquid pipe 54 becomes extremely small, waste of the liquid is extremely small, too.

When the liquid is applied drop-wise from the nozzle 58a of the droplet jet head 58 under control of the control unit 40, it is also preferred to quantitatively vary the jet amount of the liquid either step-wisely or continuously. It is further preferred to vary the change ratio of the jet amount either in proportion or in inverse proportion to the distance from the center of rotation of the glass substrate 10. It is further preferred to vary the unit jet amount of the liquid jetted from the nozzle 58a in accordance with the characteristics of the liquid or with the shape of the glass substrate 10.

When the glass substrate 10 is rectangular, for example, the operation of the droplet jet head 58 is preferably controlled in accordance with the distance between the droplet jet head 58 and the glass substrate 10 and with the moving speed of the glass substrate 10, that is, the rotating angular velocity of the sample table 51 to ensure that the liquid is applied drop-wise onto the glass substrate 10. For example, the jetting operation of the droplet jet head 58 is preferably controlled in such a manner as to provide a jetting time in which the liquid is jetted and a non-jetting time in which the liquid is not jetted.

All of the constructions described above can minimize waste of the liquid. Therefore, the liquid discharged from the waste liquid pipe 54 can be drastically decreased.

Third Embodiment

The third embodiment provides a liquid jetting method that includes the following steps (a) and (b). This is a coating method of a resist material by using an ink jet system that jets the liquid from the nozzle of a droplet jet head and applies the resist material to a stationary substrate or to a rotating substrate. the stationary substrate may be one that has been rotated by the spin coater.

(a) a step of applying a greater jet amount of the resist material to an outside region than to an inside region when a coating region of a substrate is divided into at least two, inside and outside regions, by an imaginary line positioned at a predetermined distance from the center of rotation of the substrate such as an imaginary circumference (hereinafter called sometimes "coating step"); and (b) a step of rotating or moving the substrate when the substrate is not rotated or moved, and diffusing the applied resist material (hereinafter called sometimes "diffusion step").

1. Coating Apparatus and Coating Step:

A coating apparatus and a coating step of the resist material employed in this third embodiment may have the same content as those explained in the second and first embodiments, respectively.

In other words, when the jet amount of the resist material from the droplet jet head is varied in accordance with the resist material coating position of the substrate (such as the inside region and the outside region), a film formed of the resist material having a small film thickness distribution on the entire substrate, that is, a uniform thickness, can be obtained.

When the resist material is jetted from the nozzle of the droplet jet head and the jet amount of the resist material from the droplet jet head is varied in such a manner as to correspond to the positions (inside region and outside region) of the substrate to which the resist material is applied, the amount of the resist material applied and diffused can be relatively reduced. As a consequence, waste of the resist material is reduced and efficiency of use can be improved.

When the resist material is jetted from the nozzle of the droplet jet head, the predetermined amount of the resist material can be accurately applied to the predetermined position irrespective of the shape of the substrate and the kind of the resist material. Therefore, a film having a small film thickness distribution, that is, a uniform film thickness can be obtained on the entire substrate.

When the resist material is applied to the substrate, the substrate may be rotated in advance by using a rotation jig or a movement jig, for example, the spin coater, or may be rotated and moved by a belt conveyor, for example. Alternatively, the resist material may also be applied preferably under a stationary state without rotating or moving the substrate.

2. Diffusion Step:

The diffusion step of the resist material is the step of rotating, preferably at a high speed, the substrate after the resist material is applied while the jet amount is varied, for example, by use of the spin coater, or the like, or the step of moving it by a belt conveyor, and obtaining a film having a small film thickness distribution and a uniform thickness on the entire substrate.

When the spin coater is used, the number of its revolutions is not particularly limited but is preferably within a range of 10 to 10,000 rpm, for example. This is because when the number of revolutions of the spin coater is less than 10 rpm, diffusion of the resist material is insufficient and a film of the resist material having a uniform film thickness cannot be formed easily in some cases. When the number of revolutions of the spin coater exceeds 10,000 rpm, on the other hand, the resist material is excessively diffused with the result that a coating film of a desired thickness is difficult to form, or radial fringes are likely to occur in some cases.

Therefore, it is more preferred to set the number of revolutions of the spin coater to a value within a range of 100 to 5,000 rpm, further preferably within a range of 250 to 3,000 rpm.

3. Others:

After the diffusion step is complete, the resist material is preferably heated to remove the solvent contained therein. For example, a heat/drying step is preferably conducted at a temperature condition of 50 to 120° C. for 1 to 60 minutes. Vacuum drying at a temperature condition of less than 50° C. is also preferred.

Fourth Embodiment

The fourth embodiment relates to a liquid jetting method that jets the liquid from a nozzle of a droplet jet head and applies it to a non-circular substrate rotated by a spin coater, for example. This is a jetting method having a non-jetting time in which the liquid is not jetted, sequenced with a jetting time in which the liquid is jetted from the nozzle of the droplet jet head. In this case, the substrate is stationary in some cases and has already been rotated in other cases.

The fourth embodiment also relates to a liquid jetting method that jets the liquid from a nozzle of a droplet jet head and applies it to a non-circular substrate rotated by a spin coater or to a non-circular substrate that has already been rotated. According to this method, a non-jetting time in which the liquid is not jetted is sequenced with a jetting time in which the liquid is jetted from the nozzle of the droplet jet head.

Figure 13:
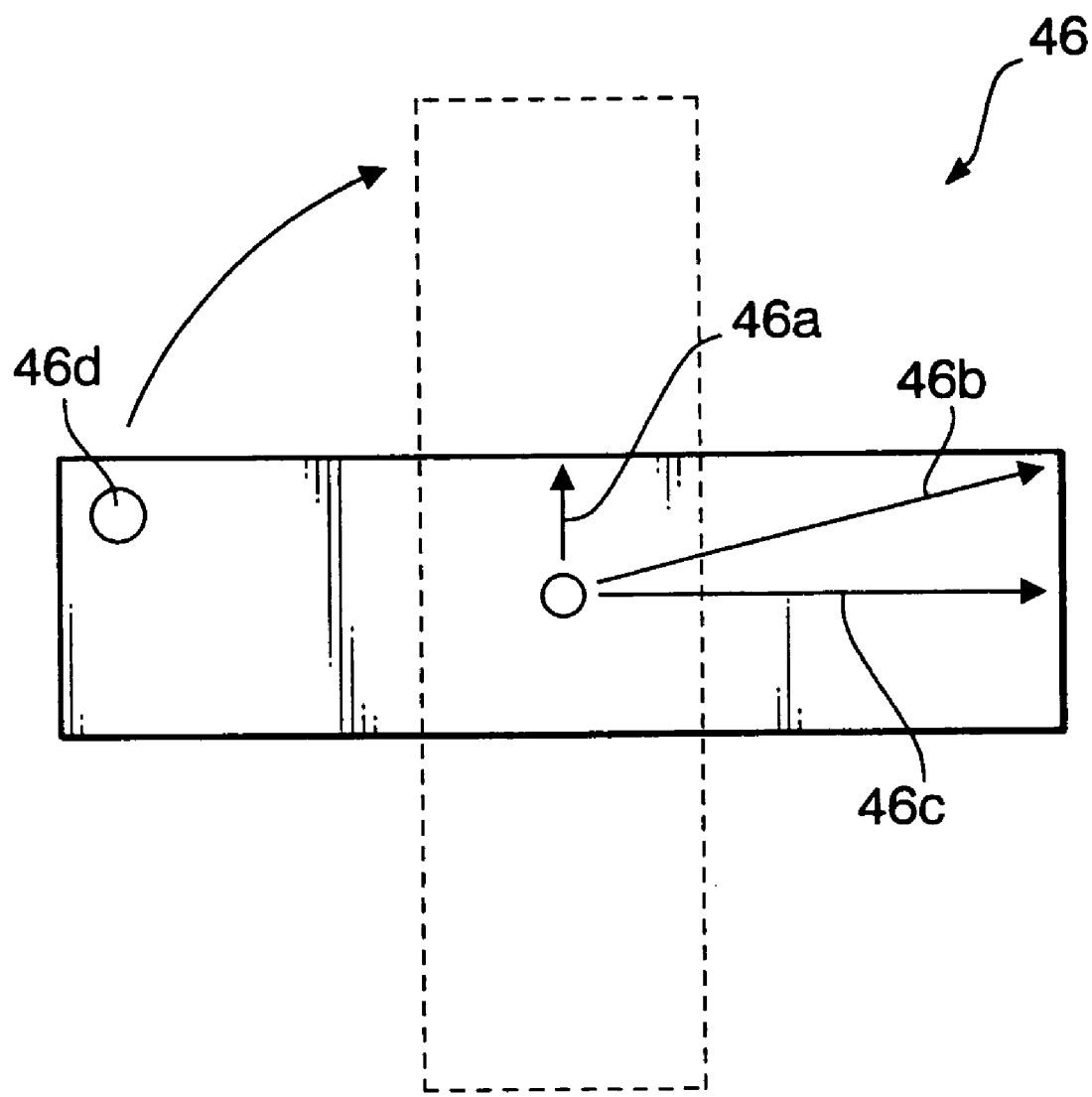
FIG. 13 is a plan view showing a rectangular substrate and its rotation state indicated by broken lines.

In other words, the substrates to which the liquid is applied include a rectangular substrate 46 as shown in FIG. 13. Unlike the circular substrate, the distances 46*a*, 46*b* and 46*c* from the center to the peripheral portions are not equal. Therefore, when the liquid is applied while the substrate 46 is rotated by use of the spin coater 24, or the like, the liquid cannot be applied to the surface of the substrate 46 in some cases. When the liquid is to be applied to a portion 46*d* indicated by a white circle in FIG. 13, for example, the liquid cannot be applied when the substrate 46 rotates and moves to the position indicated by broken lines in the drawing.

Therefore, when the substrate has a non-circular shape, the non-jetting time in which the liquid is not jetted is sequenced with the jetting time in which the liquid is jetted from the nozzle of the droplet jet head. Because the non-jetting time is provided, even when the substrate does not exist under the nozzle of the droplet jet head, the possibility that the liquid is applied to portions other than the substrate decreases and eventually, the liquid can be accurately applied without waste.

The liquid jetting method according to the fourth embodiment will be hereinafter explained more particularly.

1. Substrate:

The shape of the non-circular substrate to which the liquid is applied is not particularly limited so long as it is not circular, but may be a rectangle, a square, a polygon such as a triangle, a diamond, a pentagon, a hexagon, etc., an ellipse, an elongated circle, an odd-shape, and so forth. When a substrate that is substantially circular has a notch at a part thereof, or when a non-coating portion is provided to a substrate, the substrate is included in the non-circular substrate as a matter of convenience.

2. Jetting Time:

The term "jetting time" means the time in which the liquid is jetted. The length of the jetting time can be varied appropriately depending on the area of the substrate, the shape of the substrate, the viscosity of the liquid, the coating thickness, and so forth.

3. Non-Jetting Time:

The term "non-jetting time" means the time in which the liquid is not jetted. The non-jetting time can be interposed appropriately between the jetting times, before the start of the jetting time or after the end of the jetting time. The length of the non-jetting time can be varied appropriately depending on the area of the substrate, the shape of the substrate, the viscosity of the liquid, the coating thickness, and so forth.

When the non-jetting time is provided, it is preferably synchronized with a time in which the non-circular substrate to be coated with the liquid does not exist at the jetting position of the nozzle of the droplet jet head.

When the non-jetting time is provided in this way, the possibility that the liquid is applied to portions other than the substrate can be reliably reduced even when the non-circular substrate to be coated with the liquid does not exist at the jetting position of the nozzle of the droplet jet head, whereas the liquid can be reliably applied to the desired coating position.

Incidentally, when the nonjetting time is synchronized with the time in which the non-circular substrate to be coated with the liquid does not exist at the jetting position of the nozzle of the droplet jet head, the position of the non-circular substrate to be coated with the liquid is preferably measured either continuously or discontinuously.

It is preferred to correctly grasp the position of the non-circular substrate by, for example, arranging a position measurement mark at a predetermined position of the non-circular substrate and by measuring the position of this position measurement mark by use of an optical sensor. Alternatively, the overall position of the non-circular substrate is preferably measured by the steps of irradiating light from the back side of the non-circular substrate, arranging an optical sensor on the surface side of the non-circular substrate and detecting the transmitted light.

Jetting of the liquid from the nozzle of the droplet jet head is preferably controlled while reliably synchronizing the non-jetting time with the time in which the non-circular substrate to be coated with the liquid does not exist at the jetting position of the nozzle of the droplet jet head, on the basis of the information about the predetermined position of the non-circular substrate.

When the non-jetting time is provided, it is preferred to control the operation of the droplet jet head in accordance with the distance between the droplet jet head and the substrate, and with the angular velocity of the substrate (hence, the fitting plate) so that the liquid jetted can reliably reach the substrate.

In other words, when the substrate 46 is rectangular as shown in FIG. 13, there is the possibility that the jetted liquid is not applied drop-wise to the substrate but passes through the substrate in vain when the jetting time (that is, timing) is not suitable even if the jet amount of the liquid is appropriate.

A certain time is necessary before the liquid jetted from the nozzle 27*a* reaches the substrate 46, and applicability of the liquid also varies depending on the angular velocity of the spin coater 24. Therefore, to determine the jetting time (timing), it is necessary to take into consideration both the distance between the droplet jet head and the substrate and the angular velocity of the substrate.

In other words, it is preferred to control the operation of the droplet jet head by taking into consideration the distance between the droplet jet head and the substrate and the angular velocity of the substrate (hence, fitting plate) so that the jetted liquid is reliably applied drop-wise to the substrate. Consequently, the liquid jetted from the nozzle 27*a* can be reliably applied drop-wise to the substrate 46 to prevent waste of the liquid.

Fifth Embodiment

The fifth embodiment relates to a production method of a color filter by an ink jet system by applying the liquid jetting method according to any of the first to fourth embodiments. This production method of the color filter has its feature in that a plurality of color filter materials is sequentially jetted from corresponding nozzle trains and the jet amounts are varied in such a manner as to correspond to positions of the color filter.

Incidentally, the following explanation will be mainly directed to portions different from the foregoing embodiments, and the explanation of the common portions will be omitted appropriately.

(1) Production Method of Color Filter:

FIGS. 17(A) to 17(F) schematically show a method of producing the color filter 1 by the ink jet system step-wisely. In this production method of the color filter, color filter elements are preferably produced first by combining a photolithography method with an ink jet method.

Figure 17A:
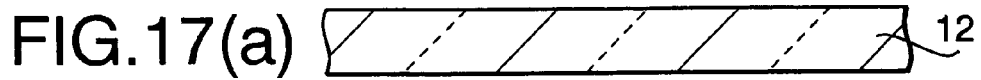
FIGS. 17(A) to 17(F) are sectional views for explaining a production process of a color filter.
Figure 17B:
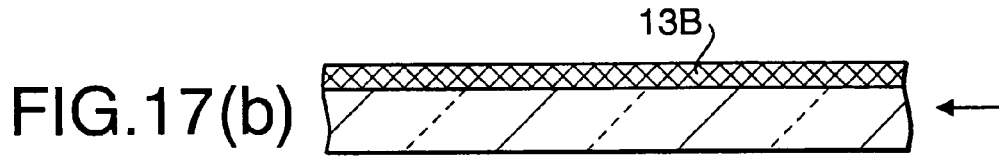

In other words, as shown in FIG. 17(A), a mother substrate 12 is first prepared. Next, one of the color filter materials such as a blue color filter material 13B is preferably applied to the surface of the mother substrate 12 by use of the ink jet method as shown in FIG. 17(B).

Figure 17C:
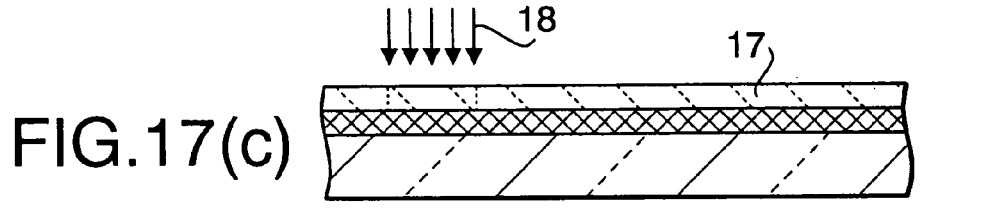

After a photo-resist 17 is applied as shown in FIG. 17(C), the portions of the substrate at which the blue pixels are to be formed are partially exposed with exposure light 18 by using a photo-mask, or the like. The area of partial exposure is preferably about 30 µm×100 µm, for example.

Figure 17D:
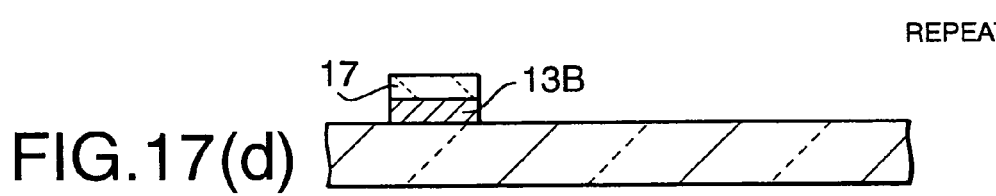

Next, the photo-resist 17 of the non-exposed portion is removed by development in accordance with the photolithography method as shown in FIG. 17(D), and the exposed blue color filter material 13B is preferably etched away.

After the photo-resist 17 is once removed to form the blue pixels 13B into a predetermined pattern, the same operation is preferably repeated for another color filter material such as a red color filter material 13R to form the red pixel 13R as in the case of the blue color filter material.

Figure 17E:
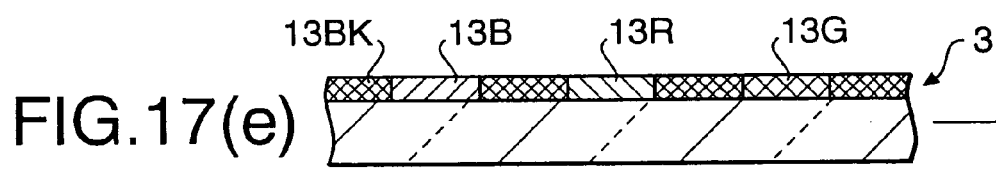

Next, the same operation is preferably repeated for the remaining color filter material such as a green color filter material and for a black matrix material as in the case of the blue color filter material to form the filter element 3 as a whole shown in FIG. 17(E).

Figure 17F:
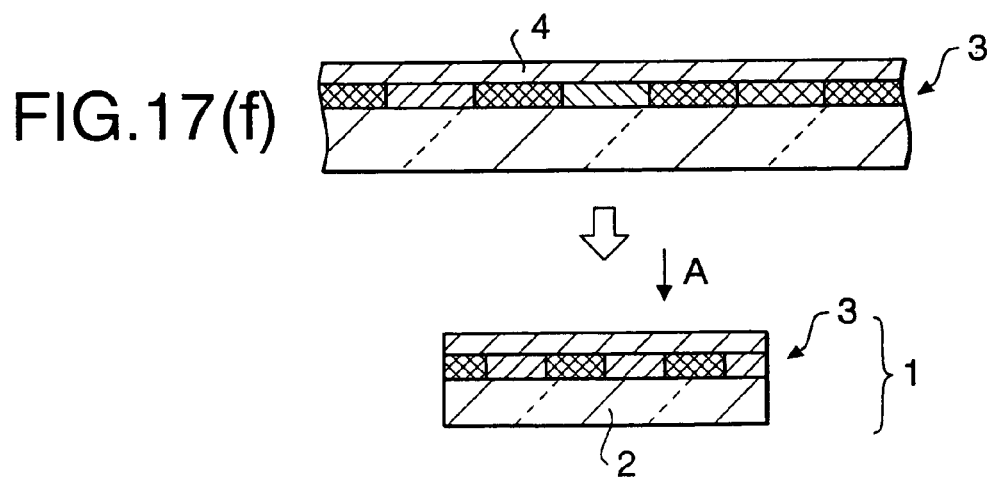

(2) Heat-Treatment and Formation of Protective Film:

To completely dry the filter element 3 so formed, it is preferred to carry out heat-treatment at a predetermined temperature for a predetermined period of time. A protective film 4 is thereafter formed to protect the filter element 3, etc., and to planarize the surface of the color filter 1 as shown in FIG. 17(F). The liquid jetting method of the invention described above is preferably employed to form this protective film 4 because waste of the liquid for forming the protective film 4 can be suppressed.

In other words, it is preferred to employ the coating method using the ink jet system explained in the first embodiment and the coating apparatus using the ink jet system explained in the second embodiment.

(3) Construction of Color Filter:

After the film elements are formed on the mother substrate 12 in the manner described above, the mother substrate 12 is sliced into an appropriate size, giving thereby the color filter 1. In this color filter 1, a plurality of filter elements 3 is formed on the surface of the rectangular substrate 2 formed of a glass, a plastic material and the like in a dot pattern, or in a dot matrix pattern, in this embodiment.

The filter element 3 is formed of a filter element material having any one of R (red), G (green) and B (blue) colors or any one of Y (yellow), M (magenta) and C (cyan) colors. In the color filter 1, the filter elements 3 of each color are arranged in a predetermined arrangement.

Figure 18A:
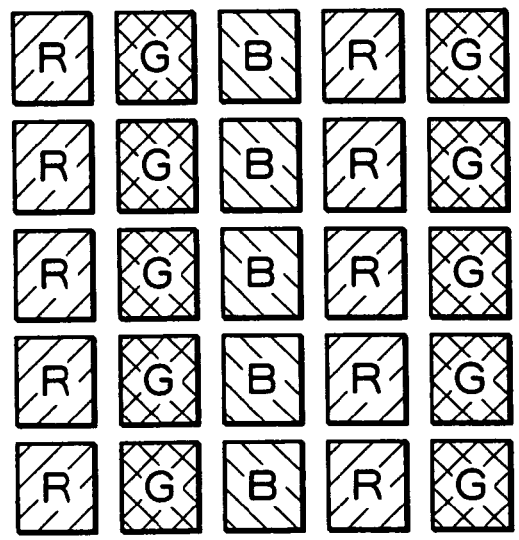
FIGS. 18(A), 18(B) and 18(C) are plan views each showing an arrangement example of filter elements in the color filter.
Figure 18B:
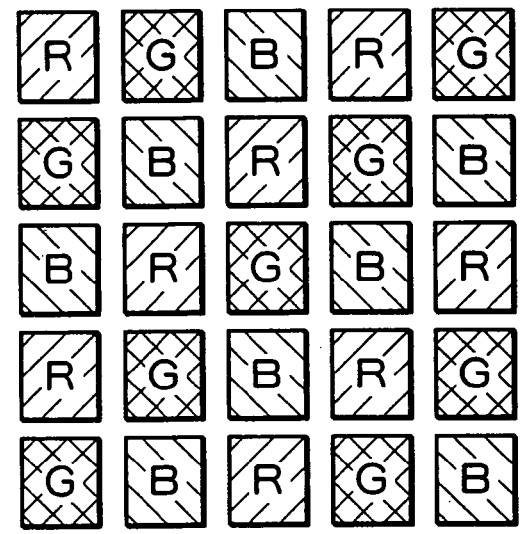
Figure 18C:
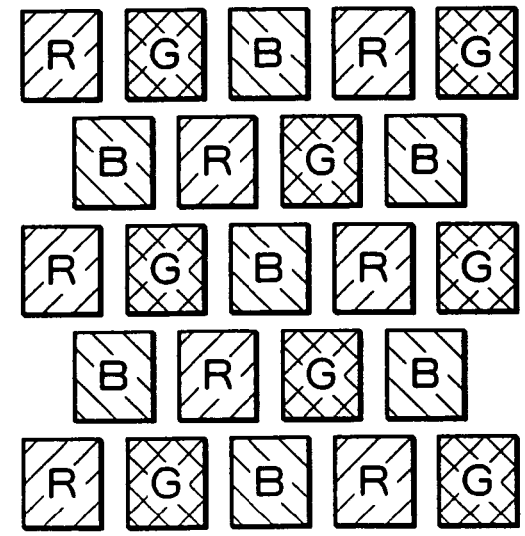

For example, FIG. 18(A) shows a so-called "stripe arrangement" in which the column of the matrix is completely occupied by the same color. FIG. 18(B) shows a three-color arrangement (or so-called "mosaic arrangement") in which arbitrary three filter elements 3 aligned in column and row are formed of the RGB pixels. FIG. 18(C) shows a three-color arrangement (so-called "delta arrangement") in which the arrangement of the filter elements 3 are staggered in levels and arbitrary three filter elements 3 adjacent to one another are formed of the RGB pixels or the YMC pixels.

The size of the color filter 1 is not particularly limited and may have a rectangular shape having a length of a diagonal of 1.8 in. (that is, 4.57 cm) in a direction of arrow A, for example. The size of one filter element 3 is not particularly limited either, and may have a rectangular shape having a width of 10 to 100 µm and a length of 50 to 200 µm, for example. The gap between the filter elements 3 or so-called "inter-element pitch" may be 50 µm or 75 µm, for example.

When this color filter 1 is used as an optical element for full color display in a liquid crystal display device, or the like, it is preferred to combine three filter elements 3 corresponding to the RGB pixels or the YMC pixels in one unit to form one pixel. Light emitted from the liquid crystal display device, etc., is preferably caused to selectively pass through any of the RGB pixels or the YMC pixels or their combination inside one pixel to achieve full color display. At this time, when a black mask 13BK is formed of a resin material substantially not-having light transmission property, it is possible to prevent color mixture and to improve contrast.

Figure 19:
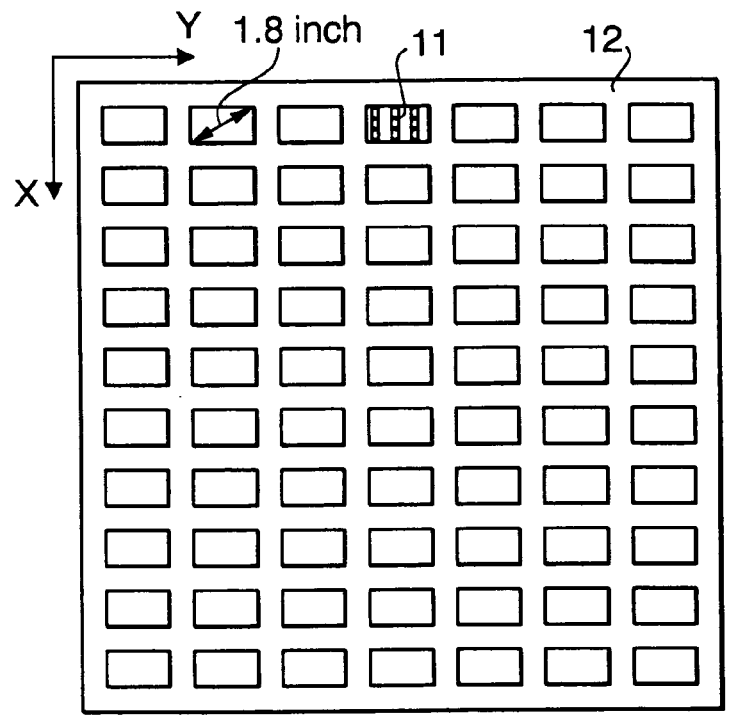
FIG. 19 is a plan view showing a mother substrate used in the production process of the color filter.

The color filter 1 described above provides a low cost of production and is economically advantageous. Therefore, the color filters 1 are preferably formed by being sliced from the mother substrate 12 having a large area as shown in FIG. 19. In other words, a pattern of one color filter 1 is formed on the surface in each of a plurality of color filter formation regions 11 set inside the mother substrate 12. Next, it is preferable that grooves for slicing are formed around the color filter formation regions 11 and the mother substrate 12 is then sliced along the groove to give the color filters 1.

(4) Use Example of Color Filter:

A liquid crystal display device can be constituted by use of the color filter 1 described above. The liquid crystal display device uses a liquid crystal as an electro-optical material. The color filter 1 functions as a substrate for an electro-optical apparatus as one of the elements of the liquid crystal display device.

The construction of the liquid crystal display device and its production method may be known. For example, it may be a liquid crystal display device 170 shown in FIG. 20. This liquid crystal display device 170 includes, from the bottom to the upper side, a first polarization plate 175, a first substrate 182, a reflecting film 174, a first electrode 181, a first orientation plate 180 and a liquid crystal element 179. Furthermore, a second orientation plate 178, a second electrode 177, a color filter 176, a second substrate 172 and a first polarization plate 171 are stacked, and a sealant 173 seals the periphery.

When a color filter 176 is formed on the second substrate 172 in this liquid crystal display device 170, the production method of the color filter shown in FIGS. 17(A) to 17(F), that is, the production method of the substrate for the electro-optical apparatus, is preferably employed.

A driver IC 183 mounted round the liquid crystal display device 170 operates the liquid crystal device 179 and achieves full-color display in accordance with a passive system of a simple matrix, an active system using TFD (Thin Film Diodes) as switching devices, an active system using TFT (Thin Film Transistors) as switching devices, and so forth.

Figure 20:
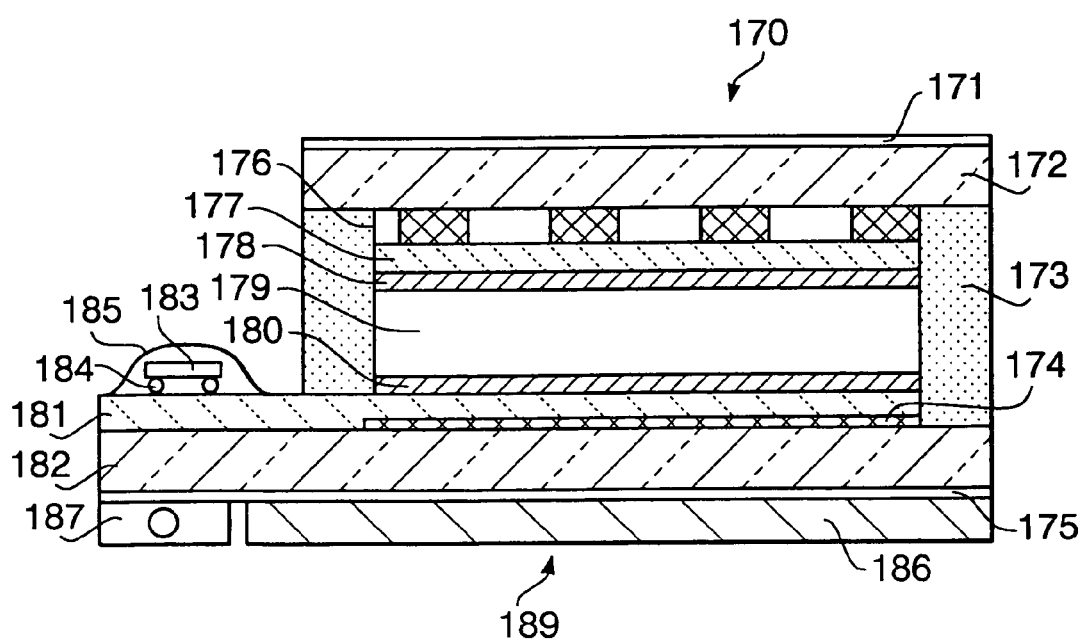
FIG. 20 is a sectional view showing an example of a structure of a liquid crystal display device.

The liquid crystal display device 170 includes a backlight 189 having a light source 187 and a light conductor plate 186 below the first polarization plate 175 in order to obtain clearer images, and so forth. The liquid crystal display device 170 may be either of a semi-transmission/reflection type, a transmission type having a light transmission portion in the substrate, or a complete reflection type as shown in FIG. 20.

Sixth Embodiment

The sixth embodiment relates to a production method of an electro-luminescence apparatus by the ink jet system by applying the liquid jetting method according to the first embodiment. The electro-luminescence apparatus is the electro optical apparatus that uses an electro-luminescence material as an electro-optical material. A substrate for an electro-optical apparatus has a structure in which an electro-luminescence material or other film material is formed in a laminar form on a substrate.

According to this production method of the electro-luminescence apparatus, the electro-luminescence material is jetted from the nozzle of the droplet jet head while the substrate for the electro-luminescence apparatus is being rotated, and the jet amount is varied in such a manner as to correspond to the coating position of the substrate.

Incidentally, the following explanation will be mainly directed to portions different from the foregoing embodiments and the explanation of the common portions will be appropriately omitted from time to time.

Figure 21:
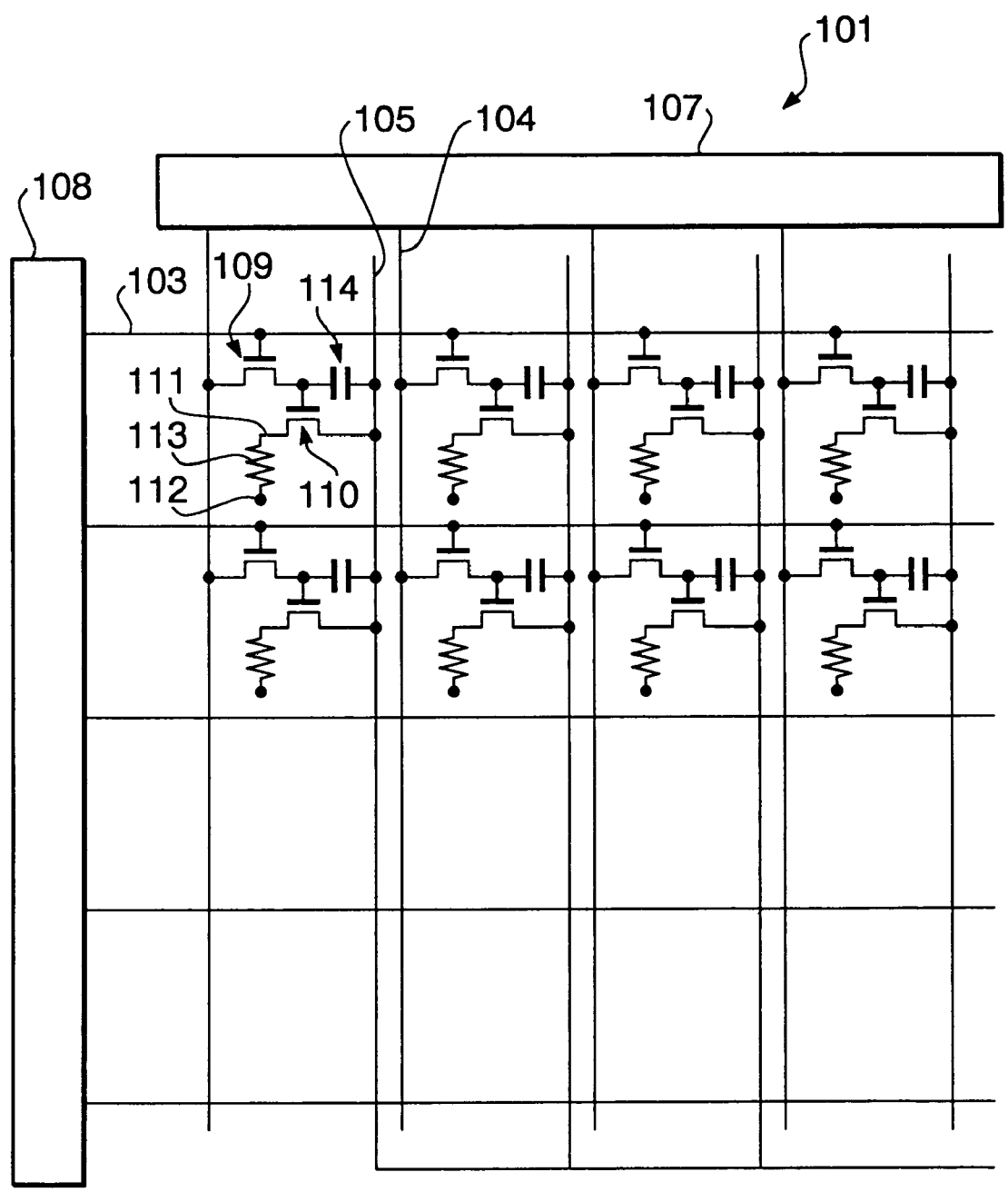
FIG. 21 is a circuit diagram showing a driving circuit in an active matrix type electro-luminescence display device.

(1) Production Method of Electro-Luminescence Apparatus:

Production steps of an active matrix type electro-luminescence display apparatus will be explained with reference to FIG. 21 showing a driving circuit schematically.

Figure 22A:
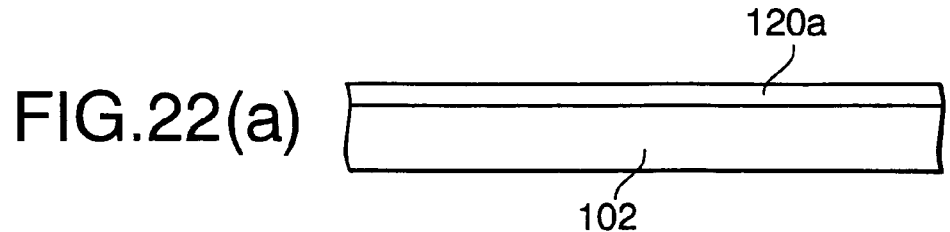
FIGS. 22(A) to 22(E) are sectional views useful for explaining a production process of the electro-luminescence device.

First, an underlying protective film (not shown) of a silicon oxide film is formed on a transparent display substrate 102 by a plasma CVD (Chemical Vapor Deposition) method using tetraethoxysilane (TEOS) and an oxygen gas as source gases as shown in FIG. 22(A). In this instance, the thickness of the underlying protective film is preferably within a range of about 2,000 to 5,000 angstroms (Å).

Next, the temperature of the display substrate 102 is set to about 350° C. and a semiconductor film 120a of an amorphous silicon film is formed on the surface of the underlying protective film by the plasma CVD method. In this instance, the thickness of the silicon film is preferably within a range of about 300 to about 700 angstroms. A crystallization step such as laser annealing or a Solid-Phase Crystallization is then applied to the semiconductor film 120a, thereby crystallizing the semiconductor film 120a to a poly-silicon (poly-crystalline silicon) film.

Figure 22B:
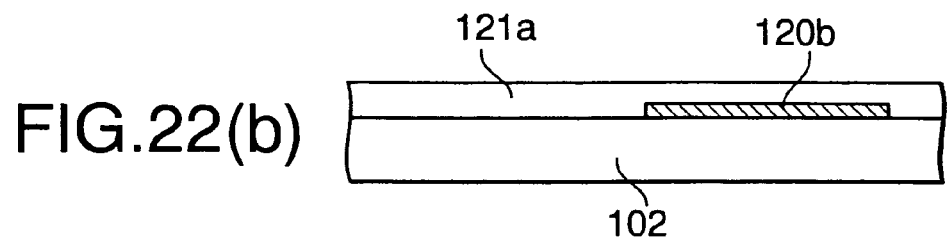

(2) Formation of TFT:

Next, a resist material is applied in accordance with the liquid jetting method of the invention described above as shown in FIG. 22(B), and a resist film thus formed is exposed and developed to give a desired mask. The semiconductor film 120a is patterned with this mask to form an island-like semiconductor film 120b. The resist material can be applied in this way without waste.

Next, a gate insulating film 121a of a silicon oxide film or nitride film is formed on the surface of the display substrate 102 having the semiconductor film 120b formed thereon by the plasma CVD method using TEOS and the oxygen gas as the source gases. In this instance, the thickness of the gate insulating film 121 is preferably within a range of about 600 to about 1,500 angstroms.

The semiconductor film 120b is to operate as a channel region and a source/drain region of a current thin film transistor 110, and a semiconductor film (not shown) to operate as a channel region and a source/drain region of a switching thin transistor 109 (see FIG. 21) is also formed at a different sectional position. In the production steps shown from FIG. 22(A) to FIG. 22(E), two kinds of switching thin film transistors and current thin film transistors are simultaneously formed. Since these transistors are formed in the same procedure, the following explanation will explain only the current thin film transistor 110 and the explanation of the switching thin film transistor will be omitted.

Figure 22C:
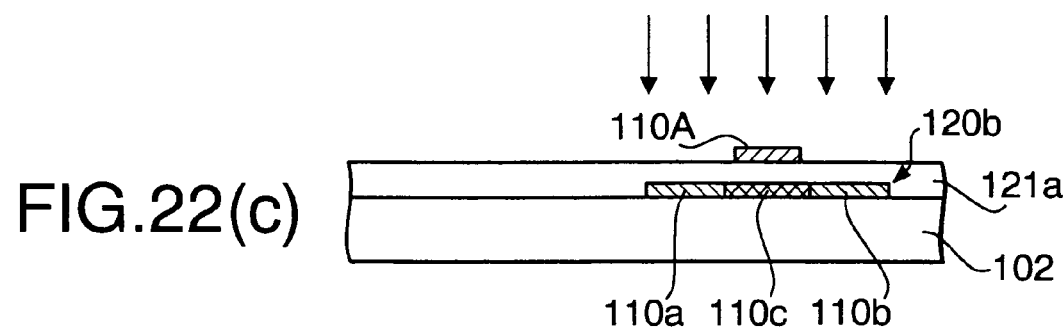

Next, a conductor film such as aluminum or tantalum is formed by sputtering as shown in FIG. 22(C). A resist material is then applied by the liquid jetting method of the invention and a resist film thus formed is exposed and developed to give a desired mask. The conductor film is patterned by use of this mask to form a gate electrode 110A. In this case, too, the resist material can be applied without waste. It is preferred to dope an impurity such as high temperature phosphorus ions under this state and to form the source/drain regions 110a, 110b in the semiconductor film 120b in self-alignment with respect to the gate electrode 110A. Incidentally, the portion into which the impurity is not doped is to operate as the channel region 110c.

Figure 22D:
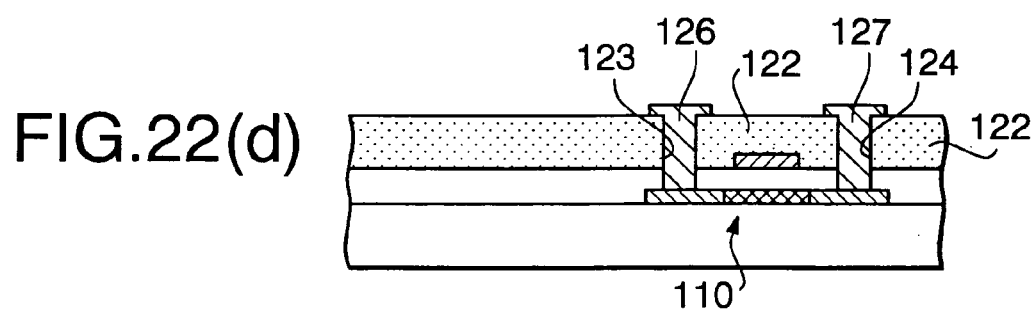

Next, after an inter-level insulating film 122 is formed as shown in FIG. 22(D), contact holes 123 and 124 are formed. Relay electrodes 126 and 127 are embedded into these contact holes 123 and 124.

Figure 22E:
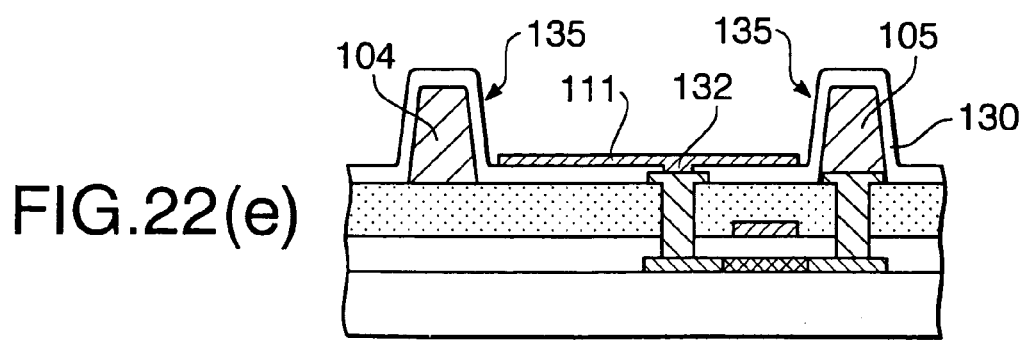

A signal line 104, a common feed line 105 and a scanning line 103 (see FIG. 21) are further formed on the inter-level insulating film 122 as shown in FIG. 22(E). An inter-level insulating film 130 is formed in such a manner as to cover the upper surface of each wire and a contact hole 132 is formed at a position corresponding to the relay electrode 126. After an ITO film is formed in such a manner as to bury the inside of the contact hole 132, the resist material is applied to this ITO film by the liquid jetting method of the present invention. The resulting resist film is exposed and developed to give a desired mask. The ITO film is then patterned with the mask to form a pixel electrode 111, electrically connected to the source/drain region 110a, at a predetermined position encompassed by the signal line 104, the common feed line 105 and the scanning line 103. In this case, too, the resist material can be applied without waste.

It is hereby possible to obtain a film having a uniform film thickness formed of the resist material by using the coating method using the ink jet system explained in the first embodiment and the coating apparatus using the ink jet system explained in the second embodiment. Since the amount of the resist material discarded can be reduced, this embodiment is advantageous for environment as well as economy.

Figure 23A:
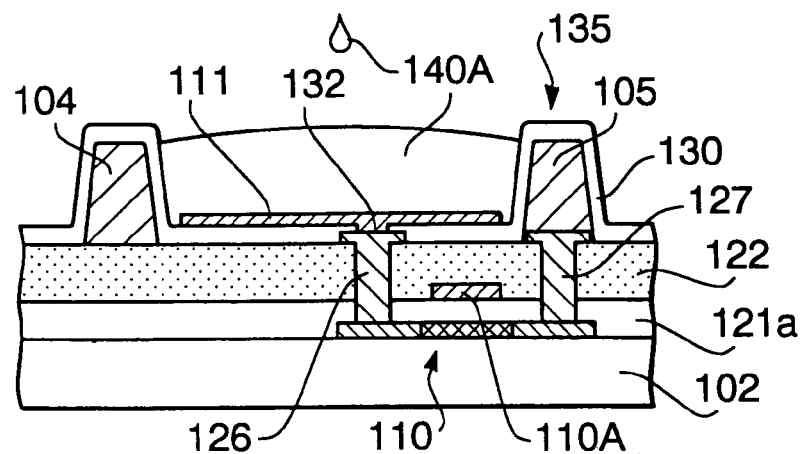
FIGS. 23(A) to 23(C) show a production process continued from the steps shown in FIG. 22(E)
Figure 23B:
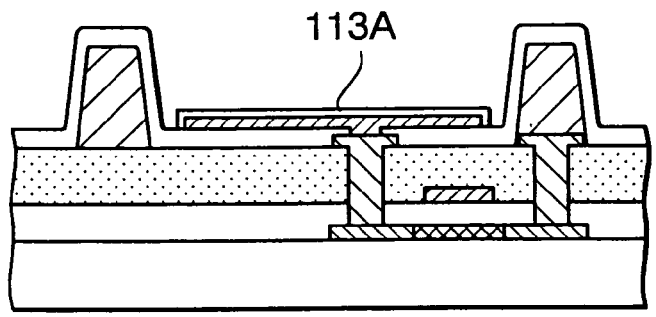
Figure 23C:
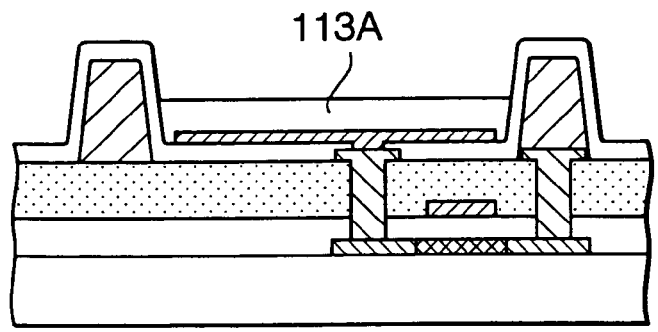

(3) Jetting of Electro-Luminescence Material:

A plurality of electro-luminescence materials are then jetted by the ink jet system to the display substrate 102 subjected to the pretreatment as shown in FIGS. 23(A) to 23(C) while the jet amounts are so varied as to correspond to the coating position. In other words, a plurality of electro-luminescence materials are serially jetted from corresponding nozzle trains. Here, an electro-luminescence material 140A for forming a positive hole injection layer 113A corresponding to a lower layer portion of a light emitting element 140 such as polyphenylenevinylene, 1,1-bis-(4-N,N-ditolylamino-phenyl)cyclohexane, tris(8-hydroxyquinolinol)aluminum, etc., is jetted by use of an ink jet system coating apparatus and is selectively applied into a region at a predetermined position encompassed by a step 135 while the upper surface of the pre-treated display substrate 102 faces upward as shown in FIG. 23(A).

Incidentally, such an electro-luminescence material 140A is preferably a precursor under a state where it is dissolved in a solvent as a functional liquid.

Figure 24A:
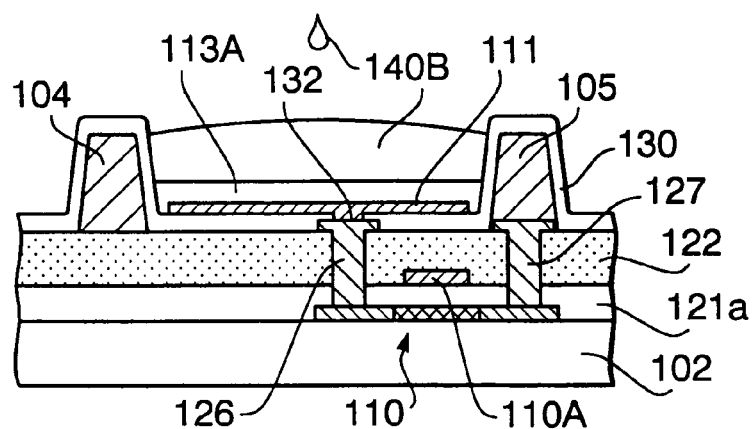
FIGS. 24(A) to 24(D) show a production process continued from the steps shown in FIG. 23(C)

Next, heating or irradiation of light is conducted to evaporate the solvent contained in the electro-luminescence material 140A to form a solid, thin positive hole injection layer 113A on the pixel electrode 111 as shown in FIG. 23(B). The process steps shown in FIGS. 23(A) and 23(B) are repeated a necessary number of times to form a positive hole injection layer 113A having sufficient thickness and size as shown in FIG. 23(C). Subsequently, an electro-luminescence material 140B for forming an organic semiconductor film 113B such as cyanopolyphenylenevinylene, polyphenylenevinylene or polyalkylphenylene is jetted on the upper layer of the light emitting element 113 by the ink jet system and is selectively applied into a region encompassed by the step 135 while the upper surface of the display substrate 102 is kept facing upward as shown in FIG. 24(A). The electro-luminescence material 140B used is preferably an organic fluorescent material under the state dissolved in the solvent as the functional liquid.

Figure 24B:
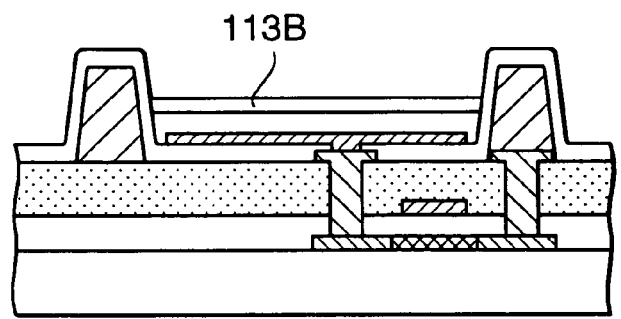

Next, heating or irradiation of light is conducted to evaporate the solvent contained in the electro-luminescence material 140B to form a solid, thin organic semiconductor film 113B on the positive hole injection layer 113A as shown in FIG. 24(B).

Figure 24C:
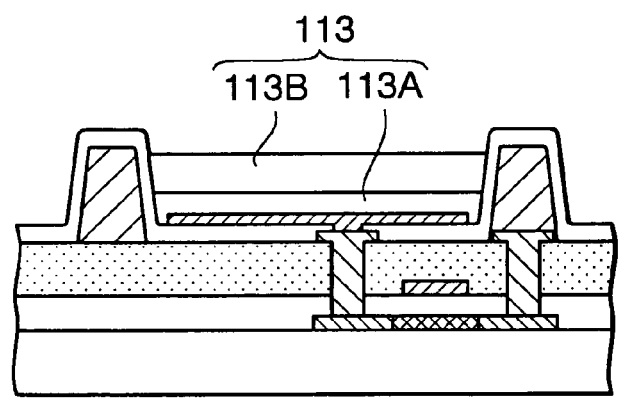

The process steps shown in FIGS. 24(A) and 24(B) are repeated a plurality number of times to form an organic semiconductor film 113B having sufficient thickness as shown in FIG. 24(C), and the positive hole injection layer 113A and the organic semiconductor film 113B together constitute the electro-luminescence light emitting element 113.

Consequently, the distribution of the film thickness in the planar direction becomes small and the electro-luminescence layer having uniform light emission characteristics and the like in the planar direction can be eventually acquired. According to this construction, mixture of colors at the boundary between adjacent regions can be reduced.

Figure 24D:
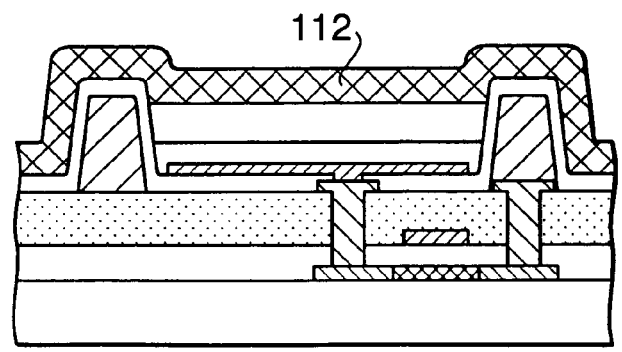

(4) Formation of Reflecting Electrode:

Finally, a reflecting electrode (that is, counter electrode) 112 is formed on the entire surface of the display substrate 102 or in a stripe form as shown in FIG. 24(D). After the reflecting electrode is formed in this way, the electro-luminescence apparatus having a sandwich structure can be produced.

(5) Modified Example of Electro-Luminescence Apparatus:

A construction of a stripe type in which three kinds of light emission pixels corresponding to the RGB pixels or to the YMC pixels are formed in the stripe form, a construction of an active matrix type display device having transistors for controlling a current applied to a light emission layer for each pixel by a driver IC and a construction of a passive matrix type can be appropriately employed as a modified example of the electro-luminescence apparatus described above.

Seventh Embodiment

Figure 25:
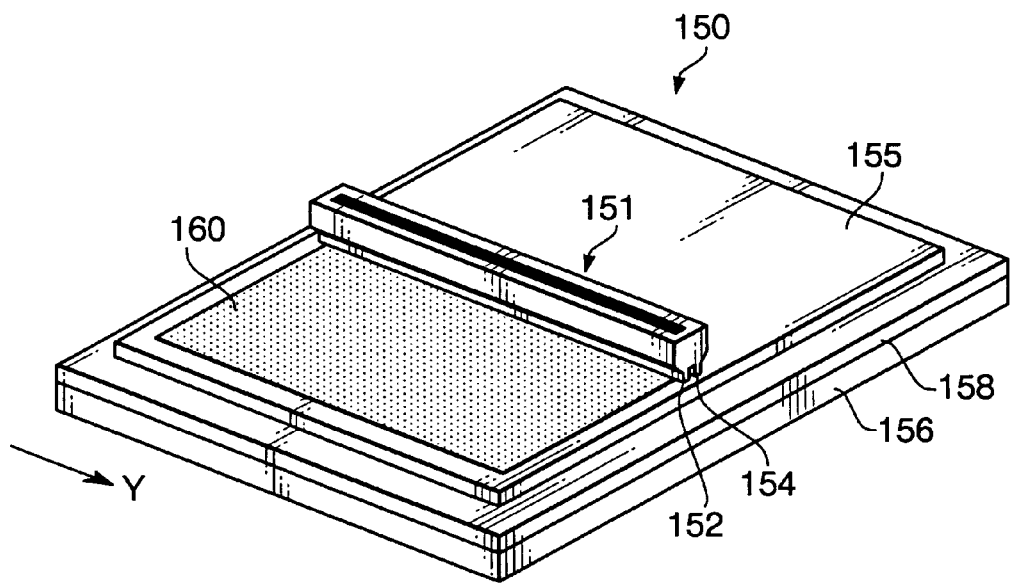
FIG. 25 shows an apparatus for executing a coating method using a knife coater.
Figure 26:
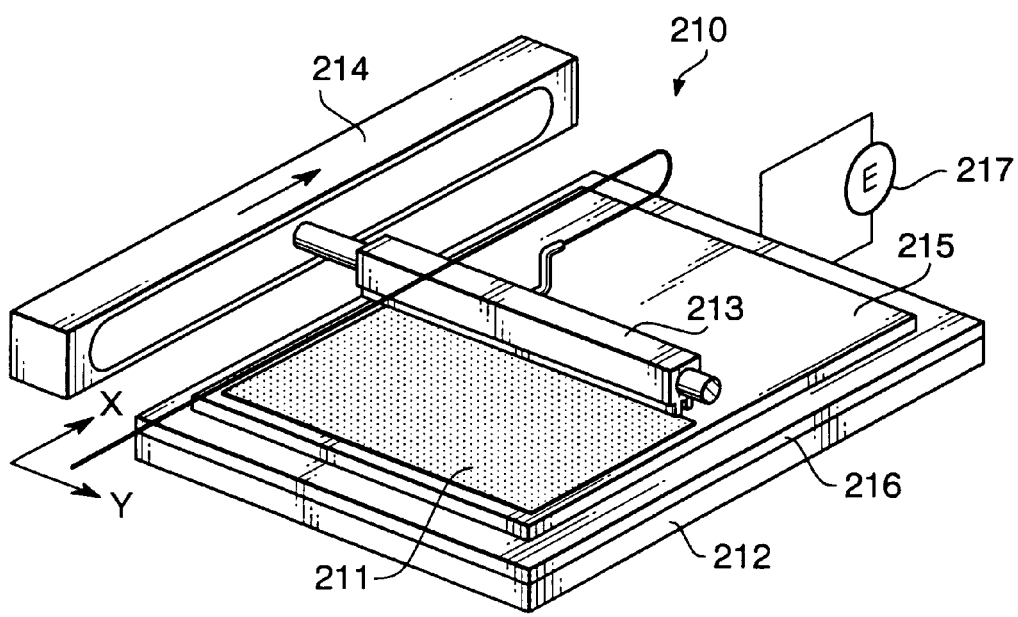
FIG. 26 shows an apparatus for executing an example of coating methods according to the prior art.
Figure 27:
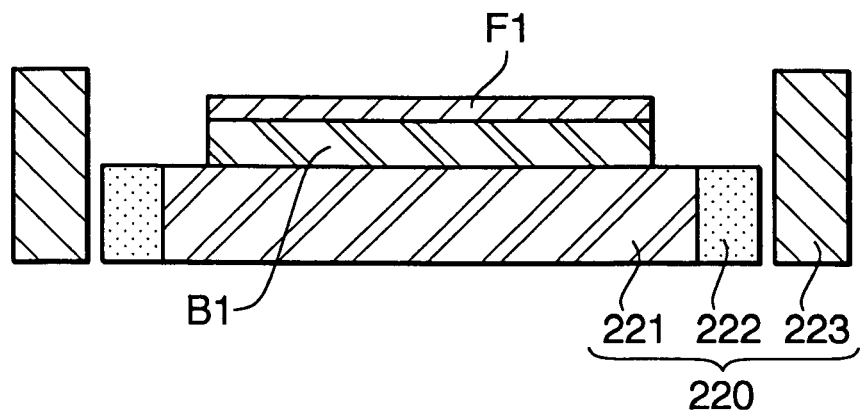
FIG. 27 shows an apparatus for executing another example of the coating methods according to the prior art.
Figure 28:
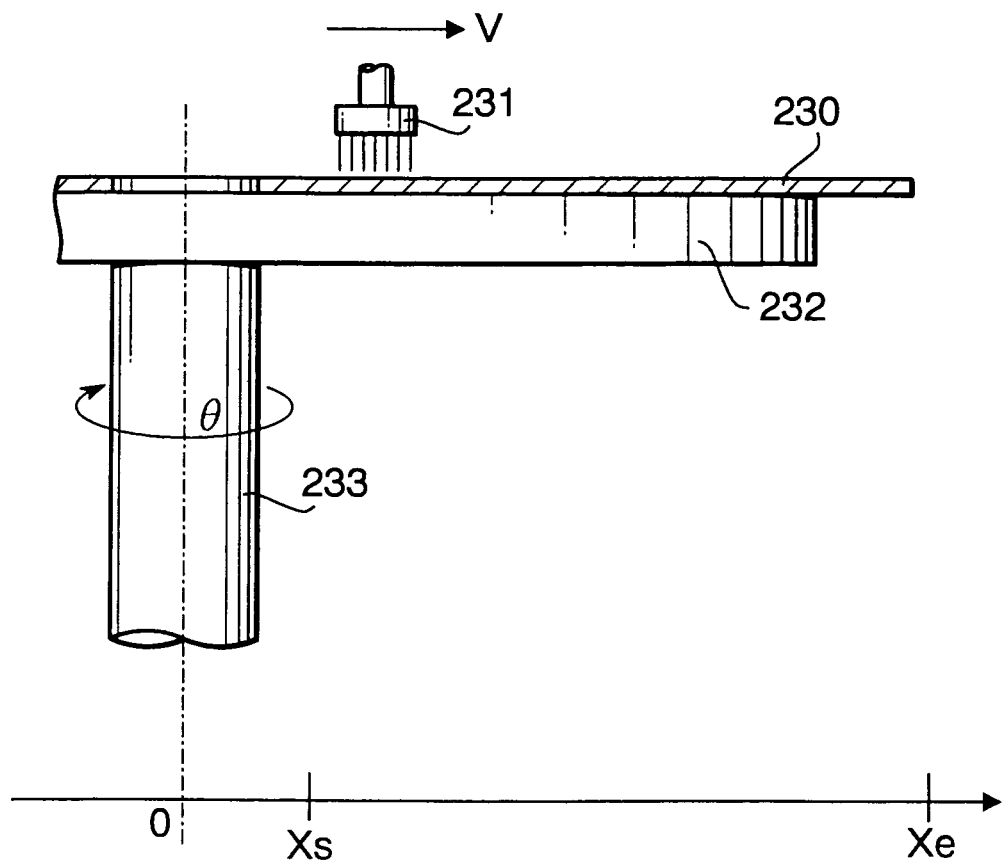
FIG. 28 shows an apparatus for executing still another example of the coating methods according to the prior art.
Figure 29:
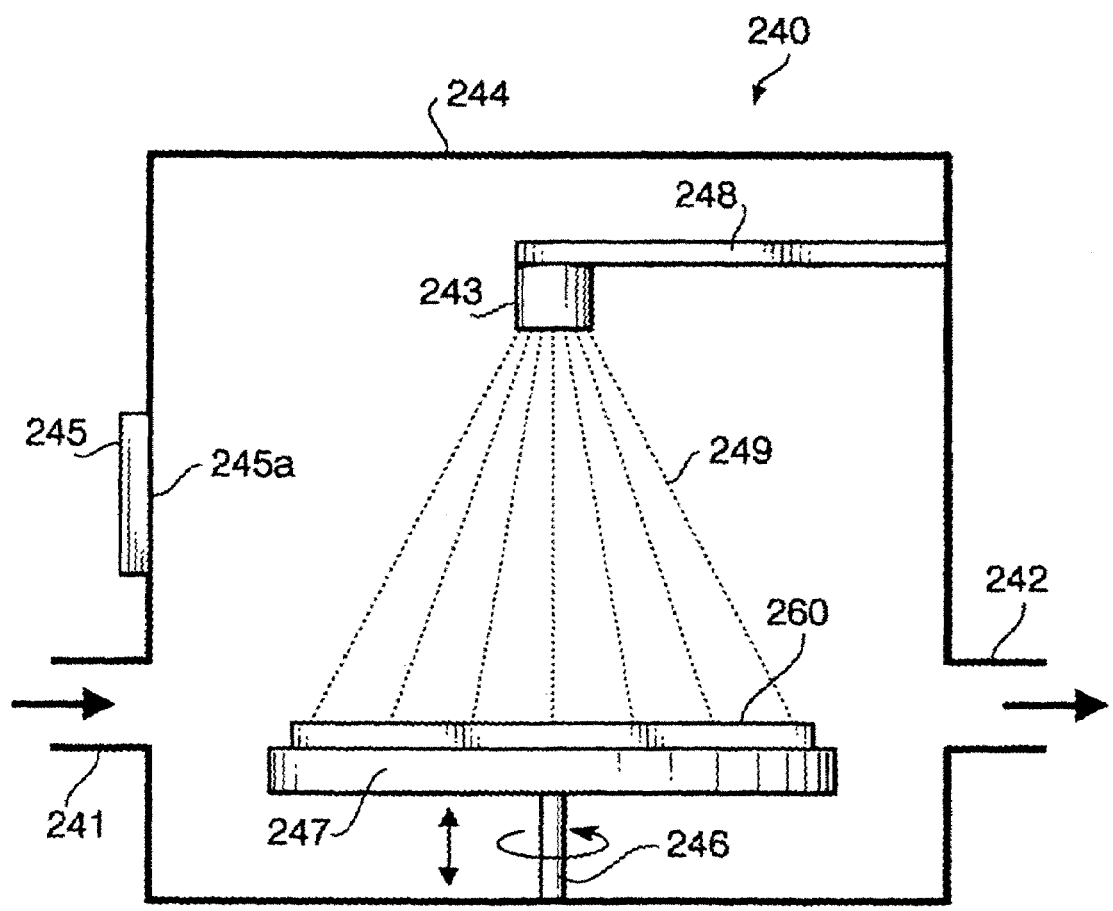
FIG. 29 shows an apparatus for executing still another example of the coating methods according to the prior art.
Figure 30:
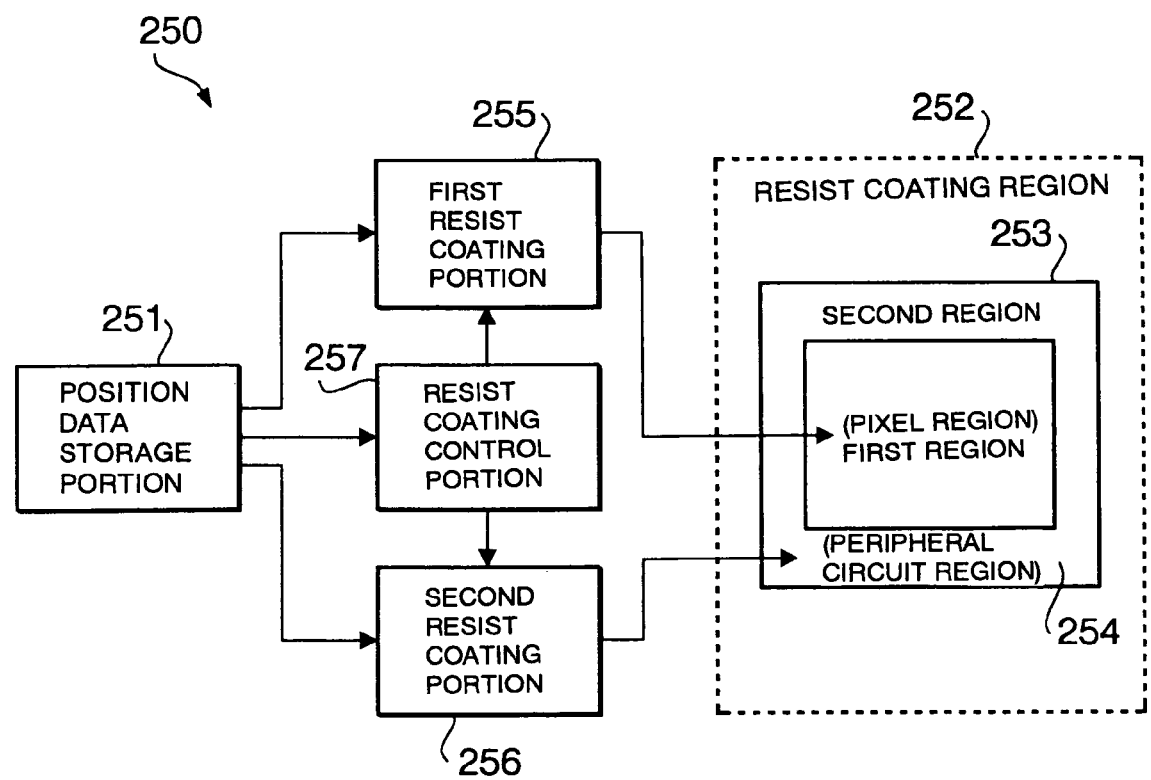
FIG. 30 is a functional block diagram of an apparatus for executing still another example of the coating methods according to the prior art.

FIG. 25 shows the seventh embodiment of the invention. The seventh embodiment relates to a liquid jetting method involving the steps of dividing the liquid coating region of the substrate into at least two regions, jetting the liquid from the nozzle train 154 of the droplet jet head 151 while changing the jet amount in accordance with the coating position on the substrate 155 so that the jet amount of the liquid to any one of the divided regions is greater than the jet amount to other regions, then diffusing the liquid in a predetermined direction by use of a knife edge 152, and converting the liquid applied to a film 160 having a uniform film thickness.

That is, it is preferred that the liquid, for example, a resist material is jetted in a beltlike manner while changing the jet amount in a crosswise direction, by using the droplet jet head 151, provided with the nozzle train 154 and the knife edge 152, instead of the droplet jet head having the nozzle as used in the first embodiment, and the head is moved on the substrate 155 to apply the liquid non-uniformly. Next, the knife-edge 152 arranged at the back of the nozzle train 154 continuously diffuses the liquid applied non-uniformly in the advancing direction of the nozzle train 154.

Preferably, separate driving portions are provided to independently operate the nozzle train 154 of the droplet jet head 151 and its knife-edge 152. The knife-edge 152 is preferably reciprocated or rotated besides the movement in the predetermined direction on the substrate 155.

In the seventh embodiment, rotation processing by using a spin coater, or the like, is preferably carried out after the diffusion step of the liquid in order to adjust the final film thickness of the resist material and the like and to secure its planarity.

Other Embodiments

Although the preferred embodiments of the invention have thus been explained, the invention is not limited to the first to seventh embodiments. For example, the invention includes the following modified example and can provide other embodiments having concrete constructions and shapes within the range that can accomplish the object of the invention.

In other words, the apparatuses, to which the liquid jetting method and the liquid jetting apparatus of the invention are applied, are not limited to the resist coating apparatus, the color filter production apparatus or the production apparatus of the electro-luminescence device described above, but the invention can be applied to a variety of electro-optical apparatuses such as a plasma display panel, an FED (Field Emission Display), an electrophoresis apparatus, a thin cathode-ray tube, a CRT (Cathode-Ray Tube), and so forth.

Also, the liquid jetting method and the liquid jetting apparatus according to the invention can be applied to a production step of various substrates included in the electro-optical apparatuses.

As may be apparent from the explanation given above, the liquid jetting method and the liquid jetting apparatus according to the invention can obtain the film having a small film thickness distribution and a uniform thickness, and can reduce waste of the liquid applied so as to remarkably improve usage efficiency by varying the jet amount of the liquid in accordance with the coating position of the substrate.

More particularly, the invention can keep the film thickness distribution of the film formed of the liquid within ±2%, within +1% on a more appropriately coating condition and within ±0.5% on a further appropriate coating condition. The invention can improve the value of usage efficiency of the jet amount of the liquid to a value of 20% or more, a value of 50% or more on a more appropriate coating condition and a value of 80% or more on a further appropriate coating condition.

It is therefore expected that the liquid jetting method and the liquid jetting apparatus according to the invention can be appropriately used for, for example, forming the film of the resist material or the protective film material, or the orientation film in the liquid crystal display device.

Because the liquid jetting method and the liquid jetting apparatus according to the invention can acquire a film having a relatively uniform film thickness even when a diffusion step is not disposed, in particular, they are suitable for the production of active type color filters and the like.

The entire disclosure of Japanese Patent Application Nos. 2002-200408 filed Jul. 9, 2002 and 2002-200413 filed Jul. 9, 2002 are incorporated by reference.

What is claimed is:

1. A liquid jetting apparatus for jetting a liquid to be applied to a substrate, comprising:
   a first droplet jet head disposed at a first distance from a center of rotation of the substrate, said first droplet jet head having a first nozzle train positioned at a first angular orientation relative to a radial direction of the substrate;
   a second droplet jet head disposed at a second distance from said center of rotation of the substrate, said second droplet jet head having a second nozzle train positioned at a second angular orientation relative to said radial direction of the substrate; and
   a third droplet jet head disposed at a third distance from said center of rotation of the substrate, said third droplet jet head having a third nozzle train positioned at a third angular orientation relative to said radial direction of the substrate;
   wherein said second distance is greater than said first distance and said third distance is greater than said second distance; and
   wherein said first angular orientation is different from said second angular orientation and said third angular orientation is different from said second angular orientation.

2. The liquid jetting apparatus according to claim 1, wherein said first droplet jet head, said second droplet jet head, and said third droplet jet head have mutually different widths and mutually different lengths.

3. The liquid jetting apparatus according to claim 1, wherein each of said first nozzle train, said second nozzle train, and said third nozzle train include a different number of nozzles.

4. The liquid jetting apparatus according to claim 1, wherein each of said first droplet jet head, said second droplet jet head, and said third droplet jet head have substantially equal widths and substantially equal lengths.

5. The liquid jetting apparatus according to claim 1, wherein each of said first nozzle train, said second nozzle train, and said third nozzle train include the same number of nozzles.

6. A liquid jetting apparatus for jetting a liquid applied to a stationary or rotating substrate, comprising:
   a first droplet jet head having at least one nozzle;
   a second droplet jet head having at least one nozzle;
   a third droplet jet head having at least one nozzle; and
   a spin coater for rotating the substrate;
   wherein said first droplet jet head is positioned at a first angular orientation relative to a radial direction of the substrate, said second droplet jet head is positioned at a second angular orientation relative to said radial direction of the substrate, and said third droplet jet head is positioned at a third angular orientation relative to said radial direction of the substrate;
   wherein said first angular orientation, said second angular orientation, and said third angular orientation are varied in accordance with a distance from a center of rotation of the substrate.

7. The liquid jetting apparatus according to claim 6, wherein said first droplet jet head, said second droplet jet head, and said third droplet jet head have mutually different widths and mutually different lengths.

8. The liquid jetting apparatus according to claim 6, wherein each of said first droplet jet head, said second droplet jet head, and said third droplet jet head have substantially equal widths and substantially equal lengths.

9. The liquid jetting apparatus according to claim 6, wherein each of said first droplet jet head, said second droplet jet head, and said third droplet jet head include a different number of nozzles.

10. The liquid jetting apparatus according to claim 6, wherein each of said first droplet jet head, said second droplet jet head, and said third droplet jet head have the same number of nozzles.

* * * * *